United States Patent
Sezi et al.

(10) Patent No.: US 6,787,244 B2
(45) Date of Patent: Sep. 7, 2004

(54) ADHESIVELY BONDED CHIP-AND WAFER STACKS

(75) Inventors: Recai Sezi, Roettenbach (DE); Andreas Walter, Egloffstein (DE)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 10/208,422

(22) Filed: Jul. 30, 2002

(65) Prior Publication Data

US 2003/0150557 A1 Aug. 14, 2003

(30) Foreign Application Priority Data

Jul. 31, 2001 (DE) .......................................... 101 37 376

(51) Int. Cl.⁷ .......................... B32B 27/00; C08L 77/00; C09J 5/02; C09J 101/00; B31B 31/00
(52) U.S. Cl. ................. 428/474.4; 428/411.1; 428/423.5; 428/425.1; 428/425.5; 428/425.6; 428/457; 428/458; 156/1; 156/60; 156/272.2; 156/272.4; 156/272.87; 156/273.3; 156/274.8; 156/275.3; 156/275.5; 156/275.7; 156/325; 156/326; 156/327; 156/330.9; 156/331.1; 156/331.5; 525/420; 525/431; 525/432; 525/434; 525/436; 524/600; 524/602; 524/606; 524/700; 526/262; 526/935
(58) Field of Search ............................ 428/474.4, 411.1, 428/423.5, 425.1, 425.5, 425.6, 457, 458; 156/1, 60, 277.2, 272.4, 272.8, 273.3, 274.8, 275.3, 275.5, 275.7, 325–327, 330.9, 331.1, 331.5; 264/297.1, 297.4, 299; 525/420, 431–432, 434, 436; 524/600, 602, 606, 700; 526/262, 935; 528/310, 322, 770

(56) References Cited

U.S. PATENT DOCUMENTS

| | | | | |
|---|---|---|---|---|
| 4,833,230 A | * | 5/1989 | Kiely et al. | 528/230 |
| 5,077,378 A | * | 12/1991 | Mueller et al. | 528/185 |
| 5,270,432 A | * | 12/1993 | Hergenrother et al. | 528/128 |
| 5,616,667 A | * | 4/1997 | Sezi et al. | 526/271 |
| 5,750,638 A | * | 5/1998 | Sezi et al. | 528/310 |
| 5,777,066 A | * | 7/1998 | Sezi et al. | 528/310 |
| 5,973,202 A | * | 10/1999 | Sezi et al. | 564/134 |

FOREIGN PATENT DOCUMENTS

| | | | |
|---|---|---|---|
| EP | 0 807 852 B1 | | 3/2001 |
| SU | 1002310 A | * | 3/1983 |

* cited by examiner

Primary Examiner—P. Hampton Hightower
(74) Attorney, Agent, or Firm—Jenkins, Wilson & Taylor, P.A.

(57) ABSTRACT

The present invention describes the use of poly-o-hydroxy amides (PHAs) for adhesively bonding articles or materials, especially components used in the semiconductor industry, such as chips and wafers, a process for adhesively bonding materials, especially chips and/or wafers, chip and/or wafer stacks produced by the process, and adhesive compositions which comprise the poly-o-hydroxy amides of the formula (I).

32 Claims, 1 Drawing Sheet a)

b)

c)

d)

e)

ADHESIVELY BONDED CHIP-AND WAFER STACKS

TECHNICAL FIELD

The present invention describes the use of poly-o-hydroxy amides (PHAs) for adhesively bonding articles or materials, especially components used in the semiconductor industry, such as chips and wafers, a process for adhesively bonding materials, especially chips and/or wafers, chip and/or wafer stacks produced by the process, and adhesive compositions which comprise the poly-o-hydroxy amides of the formula (I).

BACKGROUND ART

There is an increasing requirement for high-grade adhesives especially in electronics and microelectronics, mechanical engineering, automotive engineering, and also aerospace. In many cases the critical factor is that these adhesives must withstand the extremely high thermal and chemical loads without loss of bond strength or of physical properties. It is also important that they absorb very little water, if any, since water absorption may lead at low temperatures to stresses and cracks, and at high temperatures gives rise to blistering.

The application and testing temperatures here may amount, for example, to between −80° C. to +450° C. Particularly in micro-electronics (processes at up to 450° C.) and automotive engineering (adhesive bonds directly in the engine or transmission area), very high temperatures occur. Adhesive bonds in the area of microelectronics, chemical plant, and in the engine area necessitate very high stability of the adhesives toward solvents, acids, bases and/or aggressive gases. At the present time there is a lack in particular of adhesives which meet the requirements specified above and which are highly suitable for bonding a variety of materials, such as silicon, metal, glass, stone and/or ceramic.

In the field of microelectronics and the semiconductor industry the stacking of chips (ICs, integrated circuits) is significant owing, for example, to the increase in memory capacity, since through stacking it is possible to raise the memory capacity without increasing the area of the chip. The stacking technique is especially significant for the combination of different chips; for example, of memory chips and logic chips. Thus during the processing of the silicon wafer it is possible to carry out cost-effective production of only one kind of chips, which are later stacked atop one another and electrically contacted.

In accordance with the state of the art, materials, including chips and/or wafers, are adhesively bonded, for example, by using polyimide adhesives (C. Feger, M. M. Khojasteh, J. E. McGrath, Polyimides: Materials, Chemistry and Characterization, Elsevier Science Publishers B. V., Amsterdam, 1989, p. 151 ff.). Although the polyimides exhibit good temperature stability, the presence of the keto groups means that they absorb a relatively large amount of water, leading to the problems referred to above. Moreover, the adhesion of polyimides to many materials used in particular in microelectronics and optoelectronics is poor.

In the field of microelectronics, polyimides have been used, for example, as follows:

A polyimide is applied to the first wafer, dried, and baked in an oven at about 400° C. The surface of the polyimide layer is then activated in a plasma (argon, oxygen). This wafer is then bonded with a second, likewise plasma-activated, wafer, with the activated sides facing one another. The second wafer can, but need not necessarily, have a polyimide layer. The great disadvantage of this process is that the bonding must be performed within about one hour following activation, since otherwise the surfaces become deactivated. Moreover, owing to the presence of the carbonyl groups, polyimide may absorb water, which may lead to blistering later on when the stack is subjected to temperature. This greatly restricts the usefulness of the process. For chip-on-wafer applications it is practically impossible to employ this process, since in general up to three hours may be needed for the bonding of the chips to a wafer, especially in the case of 200 nm and 300 nm wafers.

EP 807 852 B1 discloses compositions which comprise polyhydroxy amides, a diazoquinone compound, and a phenolic compound and/or an organosilicon compound. In the tests which were carried out here, the adhesiveness fell substantially when the phenol compound or organosilicon compound was removed from the composition or was not present in the amounts stated.

The operation of chip and/or wafer bonding requires a highly temperature-resistant and chemical-resistant adhesive bond, since a stack of this kind and hence the adhesive may come into contact with aggressive solvents and gases. Moreover, the temperatures are frequently up to 450° C., in the case of tungsten CVD depositions, for example. The adhesive used must absorb very little water, if any, since otherwise there will be blistering at high temperatures and it may in some cases not be possible to produce the contacts reliably.

SUMMARY OF THE INVENTION

One objective of the present invention is to provide a facility for the reliable and permanent adhesive bonding of identical or different materials which are subjected to high thermal and chemical loads.

A further objective of the present invention is to provide permanent, chemical-stable and temperature-stable adhesive bonds between wafers and/or chips.

The present invention relates according to Claim 1 to the use of poly-o-hydroxy amides (PHAs) of the following formula (I) for adhesive bonding:

Formula (I)

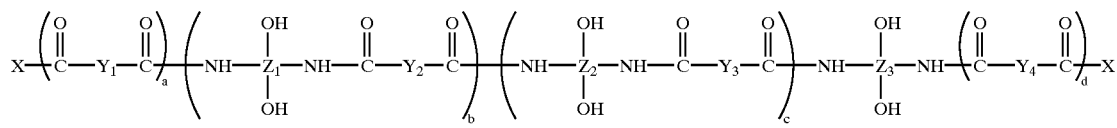

where a and d independently of one another are 0 or 1, b=0–100, and c=0–100;

where X if a or d=0, i.e., if X is attached to NH, has the following definition: —H, alkylcarbonyl, alkenylcarbonyl, cycloalkenylcarbonyl, arylcarbonyl, aralkylcarbonyl, aralkenylcarbonyl, aralkynylcarbonyl or heterocycloalkylcarbonyl each unsubstituted or substituted, it being possible for the carbonyl group to be attached to the aromatic moiety, heterocycle, or alkyl, alkenyl or alkynyl group;

and X if a or d=1, i.e., if X is attached to CO, has the following definition:

hydroxy, substituted or unsubstituted alkoxy, alkenoxy, aryloxy, cycloalkenoxy, amino, alkylamino, alkenylamino, arylamino, arylalkenoxy, arylalkylamino;

$Y_1$ to $Y_4$ independently of one another have the following definition:

substituted or unsubstituted aryl, a substituted or unsubstituted polynuclear aromatic hydrocarbon compound, a substituted or unsubstituted fused ring system, or alkyl, alkenyl, alkynyl, aralkyl, aralkenyl, aralkynyl, heterocyclo or cycloalkenyl each unsubstituted or substituted;

$Z_1$ to $Z_3$ have the following definition, where $Z_1$ to $Z_3$ can be identical to or different than one another:

aryl, aralkyl, aralkenyl, aralkynyl, heteroaryl, a polynuclear aromatic hydrocarbon compound or a fused ring system each unsubstituted or substituted.

The present invention further relates to a process for adhesively bonding materials or components, wherein:

a) poly-o-hydroxy amides of the present invention are applied to the area or areas of the materials and/or components to be bonded;

b) the areas to be bonded are contacted with one another;

c) the poly-o-hydroxy amides are crosslinked, and d) then, optionally, baking takes place in order to convert the poly-o-hydroxy amides into the corresponding polybenzoxazoles.

The invention further embraces articles and components which have been adhesively bonded by the process of the invention.

The present invention also relates to an adhesive composition comprising, based on the overall composition:

10–45% by weight of PHAs of the general formula (I), 55–90% by weight of an organic solvent, and optionally 0.1–10% by weight of a crosslinker.

DETAILED DESCRIPTION OF THE INVENTION

In accordance with the present invention poly-o-hydroxy amides are used for adhesively bonding materials and/or components, particular preference being given to their use for bonding chips and/or wafers and, in general, articles or materials which are used in microelectronics and optoelectronics.

Particularly preferred among the PHAs of the formula (I) indicated above are:

compounds wherein
b=1–20 and/or c=0–20, with further preference c=1–20.
Also particularly preferred are:
compounds where X, if a or d=0, i.e., if X is attached to NH, is:

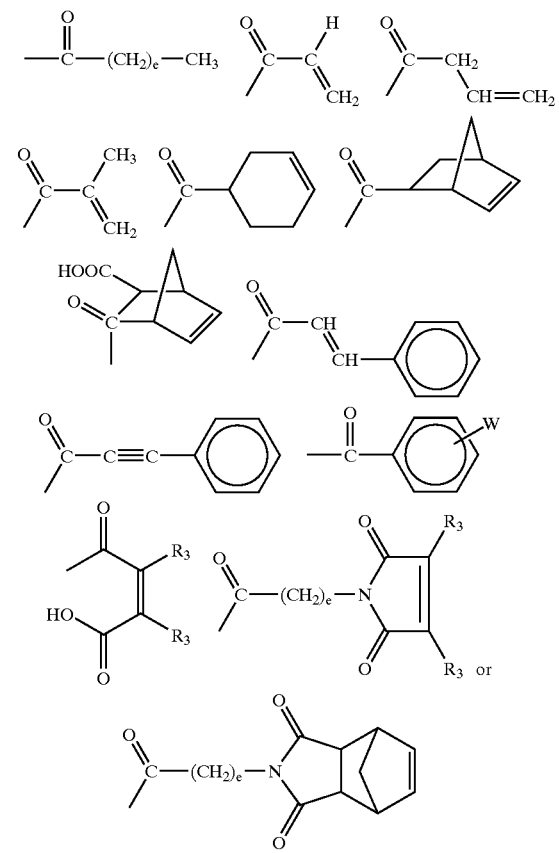

where e=0–10;
$R_3$ is: —H, and also:

—$(CH_2)_k$—$CH_3$ ($k$=0–10) —$(CF_2)_k$—$CF_3$ ($k32$ 0–10)

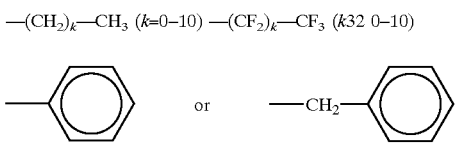

W is:

—H —CN —$CH(CH_3)_2$ —$C(CH_3)_3$

—$(CH_2)_e$—$CH_3$ —$(CF_2)_e$—$CF_3$ —Q—$(CH_2)_e$—$CH_3$
—Q—$(CF_2)_e$—$CF_3$

—Q—$CH_2$—CH=$CH_2$ —CH=$CH_2$ —C≡CH

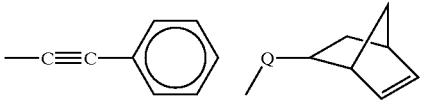

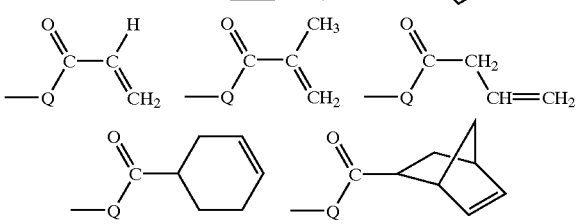

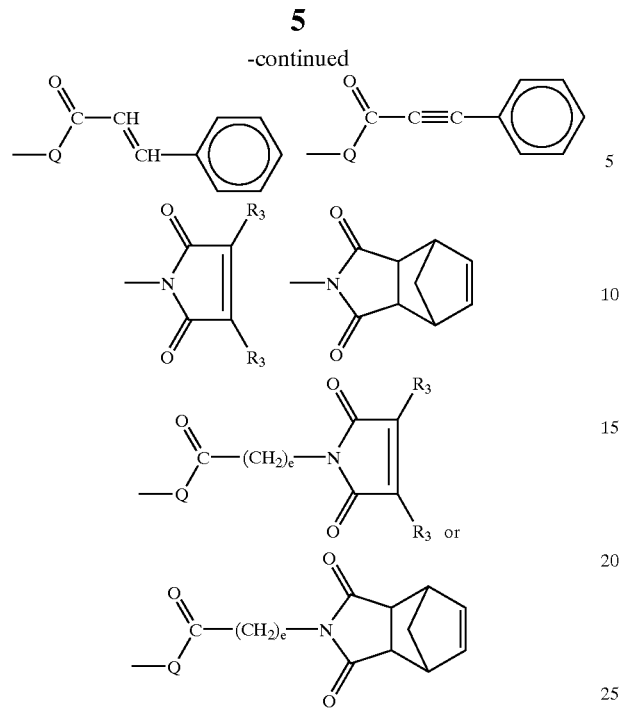
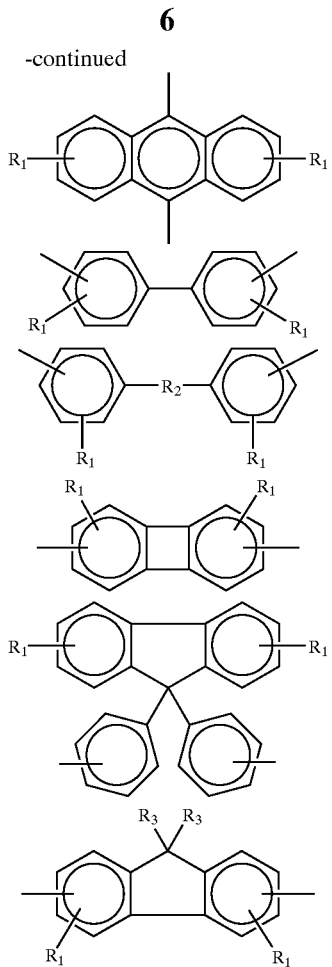
where e=0–10;
and Q is: —O—, —S— or —NH—.
Compounds wherein X, if a or d=1, i.e., if X is attached to CO, is:
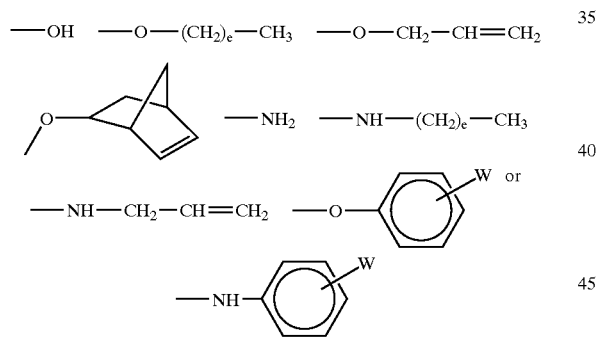
where e=0–10;
and W is as defined above.
Compounds wherein $Y_1$ to $Y_4$ independently of one another are:
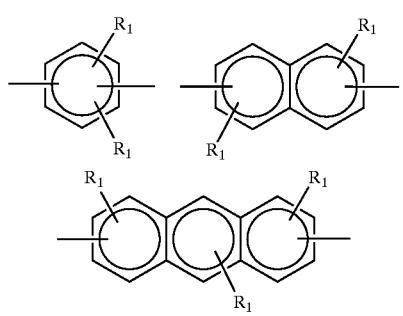
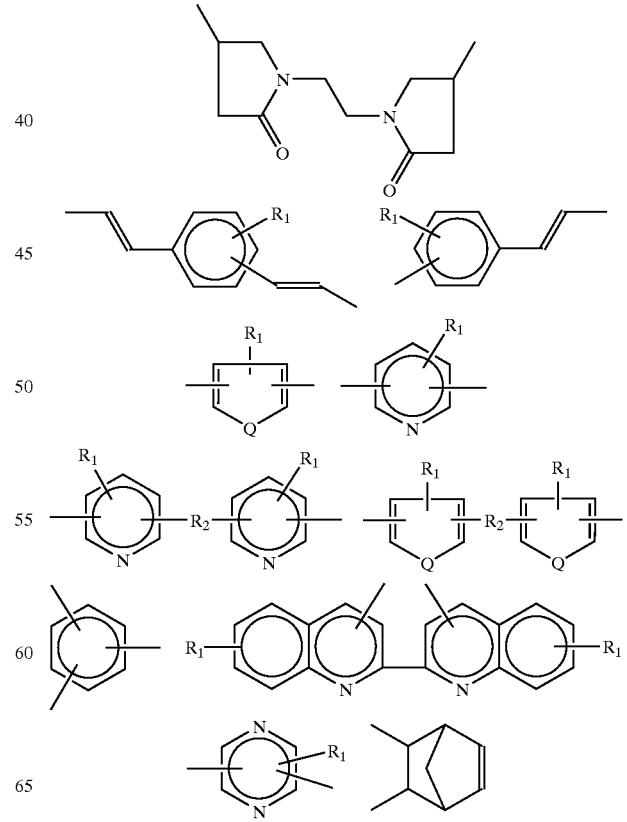

-continued
—(CH₂)ₓ—R₂—(CH₂)ₓ—
where x = 1–10; if R₂ =
—CH₂—, then x = 0–10
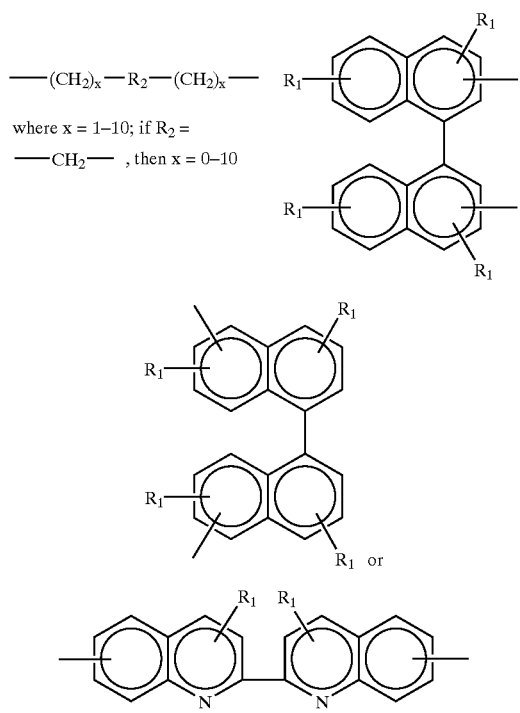
where Q is: —O—, —S— or —NH—;
R₁ is: —H, —CF₃, —OH, —SH, —COOH, —N(R₄)₂, alkyl, aryl, heteroaryl, and also:
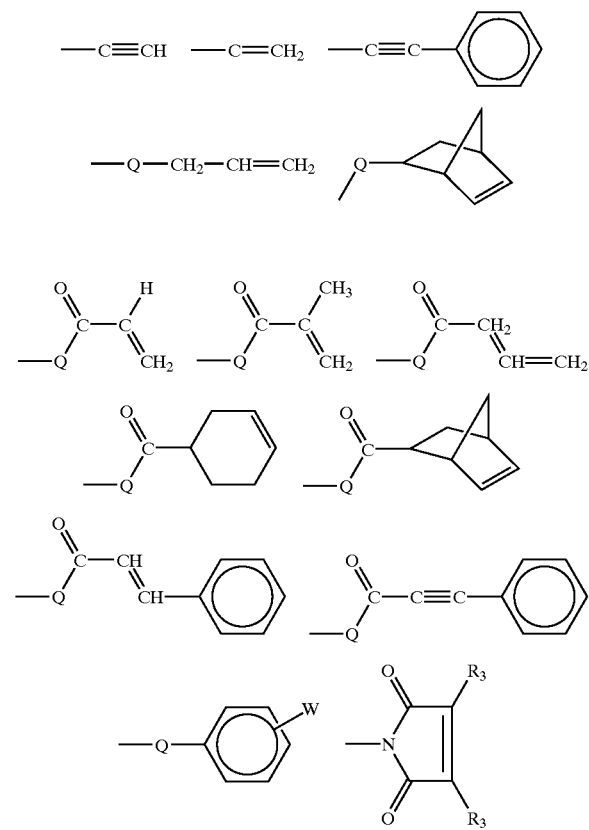
-continued
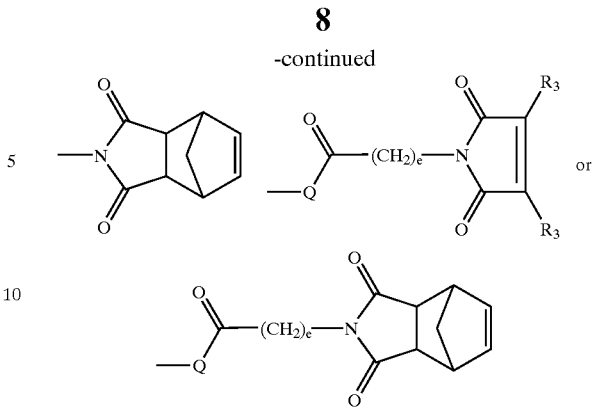
where e = 0–10;
Q is: —O—, —S— or —NH—;
R₂ is: —O—, —CO—, —NR₃—, —S—, —SO₂—, —S₂—, —CH₂—, or:
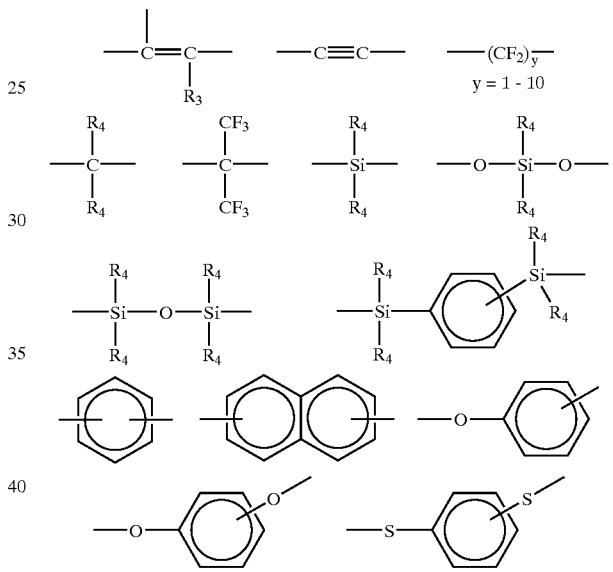
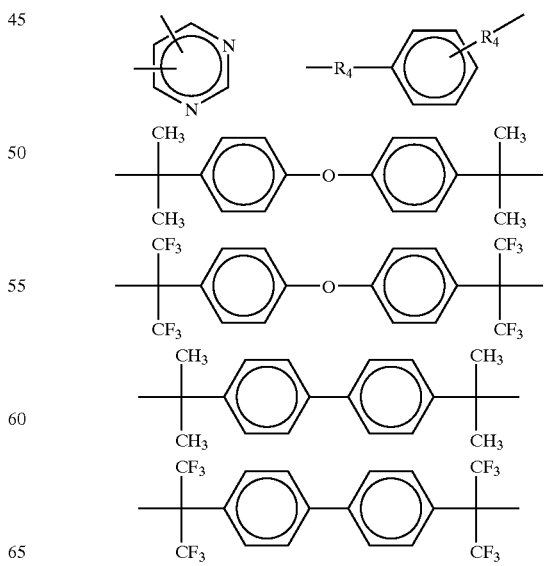

$R_3$ is: —H , and also:

—$(CH_2)_k$—$CH_3$ ($k$=0–10)  —$(CF_2)_k$—$CF_3$ ($k$=0–10)

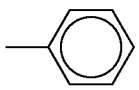 or 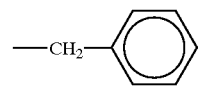

and $R_4$ is: alkyl having from 1 to 10 carbon atoms, aryl or heteroaryl.

Suitable examples of polynuclear aromatic hydrocarbon radicals, fused ring systems, and heterocyclic compounds for $Y_1$ to $Y_4$ are biphenyl, anthracene, naphthalene, fluorene, pyrene, thiophene, thiazole or benzothiazole, imidazole or benzimidazole, pyrrole, furan, pyridine or pyrazine or derivatives thereof.

Compounds wherein $Z_1$ to $Z_3$ independently of one another are:

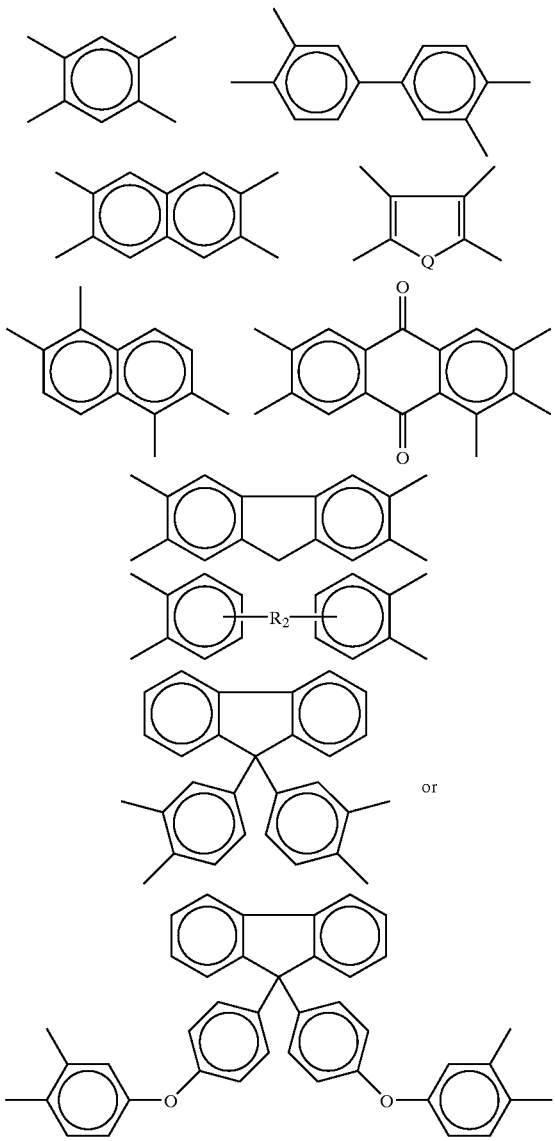

where Q is: —O—, —S— or —NH—;
and $R_2$ is as defined above.

Suitable examples of polynuclear aromatic hydrocarbon radicals, fused ring systems, and heterocyclic compounds for $Z_1$ to $Z_3$ are biphenyl, anthracene, naphthalene, fluorene, pyrene, thiophene, thiazole or benzothiazole, imidazole or benzimidazole, pyrrole, furan, pyridine or pyrazine or derivatives thereof.

Particular preference is also given to compounds wherein $Z_1$, $Z_2$ and/or $Z_3$ are:

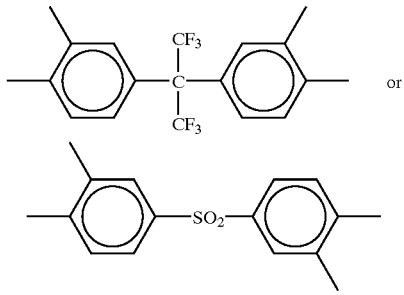

Particular preference is further given to compounds wherein $Y_1$, $Y_2$, $Y_3$ and/or $Y_4$ are:

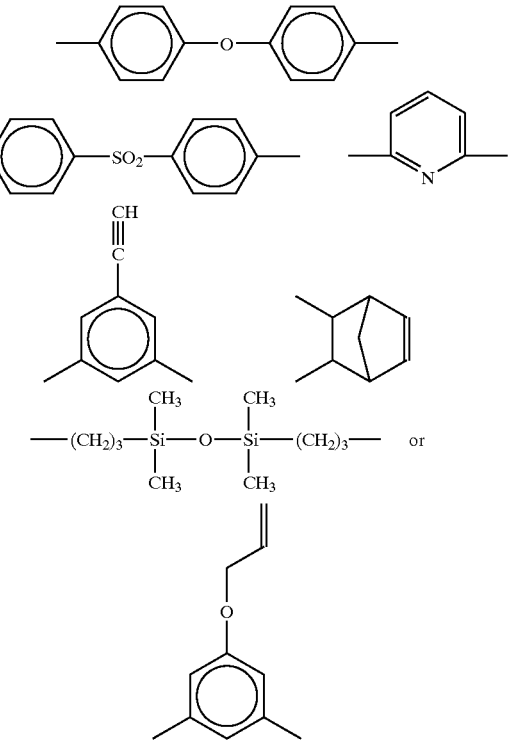

It is preferred for the polyhydroxy amides of the present invention to contain no constituents other than solvents and/or crosslinker substances. In particular, the polyhydroxy amides of the present invention preferably do not include the following constituents which are mandatorily present in the composition according to EP 807 852 B1 : (B), i.e., photosensitive diazoquinone compounds, (C), i.e., the phenolic compounds specified therein, and (D), i.e., the organosilicon compounds specified therein. It is preferred to use a composition which consists of the polyhydroxy amides described in accordance with the invention, an appropriate solvent, and, optionally, crosslinker substances.

Following crosslinking, optionally, the poly-o-hydroxy amides of the present invention are converted on baking into the corresponding polybenzoxazoles. However, the invention does not envisage using polybenzoxazoles themselves as adhesives. Polybenzoxazoles dissolve only relatively poorly, and are not soluble in many organic solvents. PHAs, especially the PHAs of the formula (I), on the other hand, are distinguished by very good solubility in a large number of organic solvents, including highly volatile organic solvents, so that the application of the PHAs to the surface of the articles to be bonded by spincoating, spraying, spreading or brushing techniques, in contradistinction to polybenzoxazoles, with a very large number of organic solvents, especially highly volatile solvents, is particularly favorable.

The polyhydroxy amides of the invention can be prepared by processes which are known per se. Conventionally, a bisaminophenol for introducing the group $Z_1$, $Z_2$ and/or $Z_3$ is first reacted with a dicarbonyl chloride for introducing the group $Y_1$, $Y_2$, $Y_3$ and/or $Y_4$. The product obtained is then reacted with a compound for introducing the terminal group X, e.g., an X-carbonyl chloride or an anhydride. For polyhydroxy amides where a and/or d=1, X is introduced, for example, in the form of an alcohol X—OH or amine X—$NH_2$.

The poly-o-hydroxy amides of the present invention can be used with preference for permanent bonding of the following materials and/or articles or articles with surfaces of the following materials: aluminum, titanium, vanadium, chromium, manganese, iron, cobalt, nickel, copper, zinc, steel, brass, palladium, silver, tin, tantalum, tungsten, platinum, gold, lead, carbon, including layers containing carbon and deposited by means of plasma, carbon fibers, silicon or germanium.

Further-preferred materials are alloys of the abovementioned materials and compounds of the abovementioned materials with oxygen and/or nitrogen, especially silicon carbide, silicon nitride, silicon oxide, titanium nitride, tantalum nitride, silicon oxynitride, tungsten nitride, gallium arsenide, gallium nitride, gallium indium phosphite, indium-tin oxide.

Fundamentally, particular preference is given in accordance with the invention to adhesively bonding those compounds which are employed in microelectronics and optoelectronics.

Further materials suitable for adhesive bonding in accordance with the invention include ceramics, glass ceramics, glasses, clayware, porcelain, stoneware and/or silicates. Glasses which can be used with preference include quartz glass, soda glass, potassium glass, soda-potassium-lime glass, boron-alumina glass, borosilicate glass, and potassium-lead glass. Enamel can likewise be bonded with preference in accordance with the invention.

Furthermore, various minerals, such as marble, basalt, limestone, granite, and concrete, can be bonded with preference in accordance with the invention.

All of said materials can be adhesively bonded to themselves or to another of the abovementioned materials.

The parts to be bonded to one another in accordance with the invention withstand temperatures in the range of between −80° C. to 400° C., in the majority of cases up to 450° C. or higher, without any problem of detachment. This is favored by the very low water absorption of the poly-o-hydroxy amides used in accordance with the invention. There is no decrease in bond strength following multiple exposure within this temperature range. Additionally, following the action of solvents, chemicals or aggressive gases on the bonded parts, including the adhesive, the bond strength is not substantially impaired. It is a particular advantage of the present invention that poly-o-hydroxy amides of the general formula (I) can be used universally for the permanent and reliable adhesive bonding of a variety of materials, with the bonds being extremely stable toward temperature and chemical exposures.

The present invention is especially suitable for the adhesive bonding of chips and/or wafers. This is carried out with the aim of stacking chips (integrated circuits), since this makes it possible to increase the memory capacity without increasing the area of the chip. Its stacking technique is particularly significant, however, for the combination of different chips; for example, of memory chips and logic chips. During the processing of the silicon wafer it is possible, for instance, to carry out cost-effective production of one kind of chips which are subsequently stacked atop one another and electrically contacted.

In accordance with the invention, the stacking can be done, for example, either by stacking wafers on wafers or by stacking chips on wafers. In each case, when processing is at an end, the individual stacks require separation from one another, by sawing, for example.

Stacking takes place in accordance with the invention by means of bonding with the poly-o-hydroxy amides of the invention. Bonding with these high temperature stable, permanent adhesives of the invention has the advantage that these adhesives can be processed by the technique of spincoating, which is a standard operation in microelectronics. Spincoating and bonding may be followed without problems by other clean-room operations such as sputtering or etching. In accordance with the state of the art, stacking is frequently accomplished by means of soldering. In this case, however, the implementation of downstream processes in chip manufacture is no longer possible in a "clean room", since the soldering operation is cleanroom-incompatible.

The present invention also relates to a process for adhesively bonding materials and components. In principle the process comprises the steps of:

applying poly-o-hydroxy amides of the present invention to the area or areas of the materials or components to be bonded;

contacting the areas to be bonded with one another, and crosslinking the poly-o-hydroxy amides;

and optionally then baking to convert the poly-o-hydroxy amides into the corresponding polybenzoxazoles.

Crosslinking takes place, in accordance with the invention, preferably by means of temperature treatment, laser treatment, ultrasound or microwave treatment, with temperature treatment being particularly preferred. Crosslinking presumably takes place substantially with the participation of the terminal groups (endcaps) of the poly-o-hydroxy amides of the invention.

The temperature treatment takes place preferably at a temperature of 80–280° C., with further preference 120–220° C., for 1–30 min, preferably 2–10 min.

Contacting of the areas takes place preferably under an applied pressure of 0.5–10 N/cm$^2$, preferably 4–6 N/cm$^2$.

The optional subsequent baking step takes place preferably at a temperature of 280–420° C., more preferably 320–400° C., for a period of 20–120 min, more preferably 40–80 min.

The poly-o-hydroxy amides of the present invention are applied preferably in the form of a powder to the areas which are to be bonded and the powder is converted by heating into a melt which can be spread over the surface.

In accordance with a further, preferred embodiment the poly-o-hydroxy amides of the present invention may be applied as a melt, or in solution in an organic solvent, to the surface or area that is to be bonded, by spincoating techniques, spraying or spreading or brushing. In the case of solvent-based systems, drying is advantageous, and in many cases is also necessary.

Examples of suitable solvents for the poly-o-hydroxy amides of the invention include N-methylpyrrolidone, γ-butyrolactone, ethyl lactate, ethoxyethyl propionate, tetrahydrofuran (THF), cyclopentanone, cyclohexanone, ethyl acetate, isopropanol, ethanol, acetone or diethylene glycol monomethyl ether or mixtures thereof.

The PHAs are preferably in a concentration of 10–45% by weight, more preferably 20–35% by weight, based on the overall composition; the solvent is preferably in a concentration of 55–90% by weight, more preferably 65–75% by weight. By means of the PHA content it is possible to control the viscosity of the composition.

The solution of poly-o-hydroxy amides and organic solvent may optionally contain, based on overall composition, 0.1–10% by weight, more preferably 0.1–5% by weight, with further preference 0.5–3% by weight, of a crosslinker. By using crosslinkers it is possible to exert a positive influence over the cure behavior, strength, and thermal and chemical stability of the poly-o-hydroxy amides. Crosslinkers which can be used in this context include short-chain compounds containing at least two groups capable of addition polymerization or polycondensation. As crosslinkers it is possible to employ crosslinkers which are known in the state of the art. With preference it is possible in accordance with the invention to use the following compounds as crosslinkers:

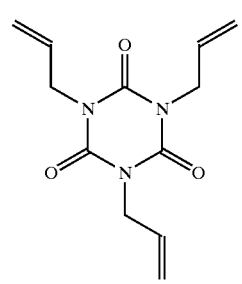

V1

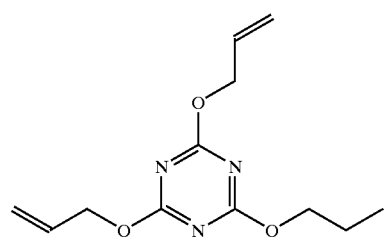

V2

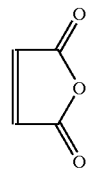

V3

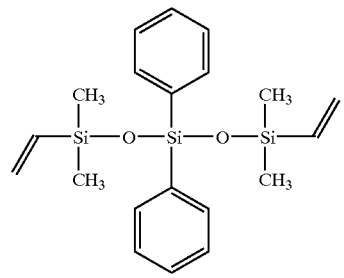

V4

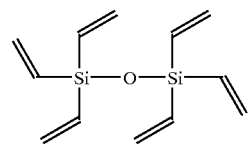

V5

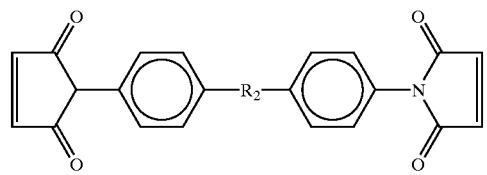

V6

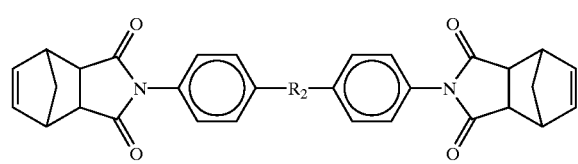

V7

-continued

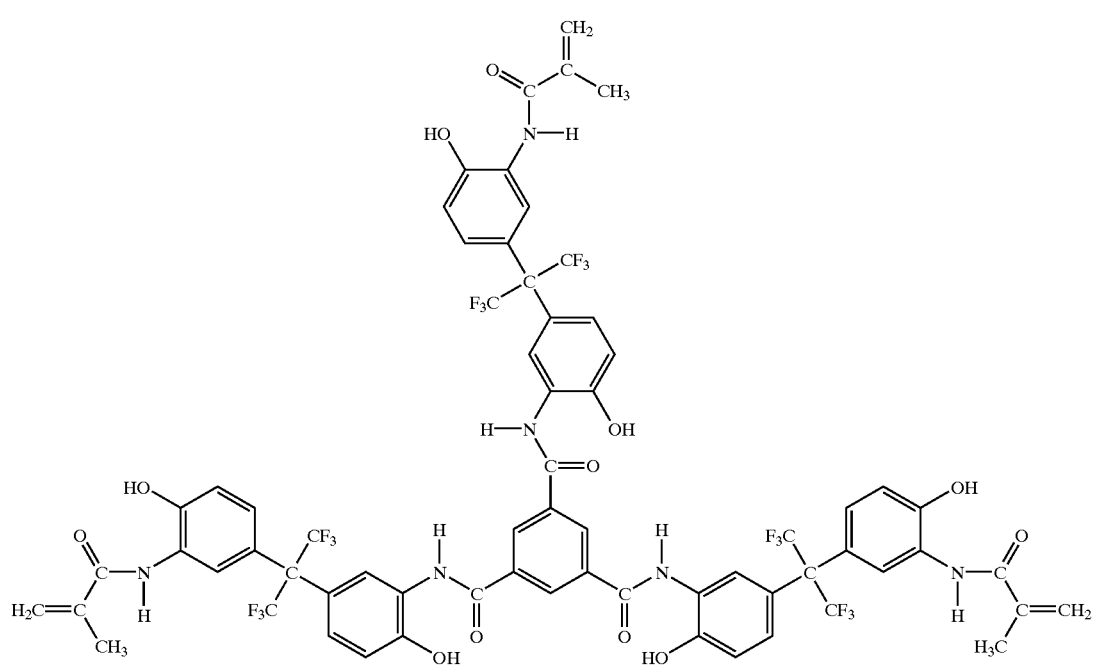

V8 where $R_2$ is as defined above.

In order to improve the adhesion properties, the (surface) areas to be bonded may be cleaned and/or roughened beforehand by means of plasma, solvent, sandblasting, flaming or brushing or other mechanical abrasion techniques. Dust residues can be removed, for example, by blowing with compressed air or washing in water.

In order to remove residues of oils and fats or other impurities, the components to be bonded may be treated with solvents such as, for example, acetone, alcohols, halogenated hydrocarbons or aromatic hydrocarbons.

It is further preferable, before applying poly-o-hydroxy amide, to apply an adhesion promoter to at least one of the areas to be bonded. By using adhesion promoters it is possible to enhance the wetting of the surface to be bonded and thus the adhesion of the poly-o-hydroxy amides to the surfaces relevant in microelectronics, such as silicon, silicon oxide, silicon nitride, tantalum nitride, glass or quartz, for example.

Adhesion promoters which are particularly suitable in accordance with the invention are silanes containing at least one alkoxy group. Preference is given to N-(2-aminoethyl)-3-aminopropylmethyldimethoxysilane; 3-aminopropylmethyl-diethoxysilane; 3-(N-allylamino) propyltrimethoxysilane or (3-acryloyloxypropyl) trimethoxysilane (see formulae).

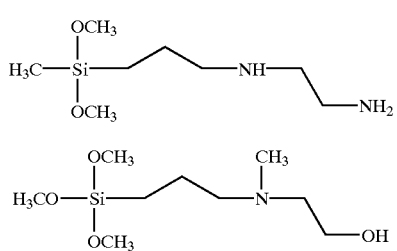

HV1

HV2

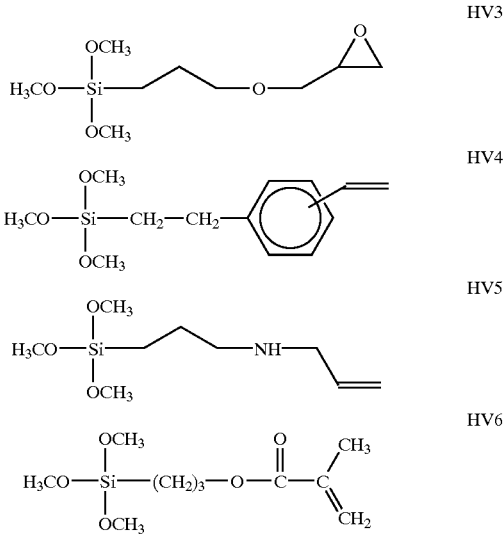

HV3

HV4

HV5

HV6

It is preferred to apply the adhesion promoter to one of the areas to be bonded and the poly-o-hydroxy amide to the other of the areas to be bonded.

It is also possible in accordance with the invention, however, first to apply an adhesion promoter to both areas and then to apply the poly-o-hydroxy amide to one or both of the areas to be bonded.

The adhesion promoter is preferably applied to the area to be bonded in a substantially monomolecular layer. The adhesion promoters are normally dissolved with a concentration of approximately 0.5% by weight in a mixture of methanol, ethanol or isopropanol with approximately 95% by weight and 5% by weight of fully deionized water, and used further in this form.

The adhesion promoter is preferably applied by spincoating. This technique is known to the skilled worker. The area to be bonded may also be dipped into the solution of the adhesion promoter and subsequently blown dry. The areas treated with the adhesion promoter should be adhesively bonded within two hours.

The process of the present invention is especially suitable for stacking chips and/or wafers with one another and bonding them.

One chip or wafer stacking process which is preferred in accordance with the invention comprises adhesively bonding a base wafer carrying functional chips to a second, thinned wafer, likewise carrying functional chips. In this case the thinned wafer is located on another, unthinned wafer, which only has a carrier function. After the two wafers carrying functional chips have been bonded, the carrier wafer is separated from the stack. This process is depicted in FIG. 1. First of all, the base wafer 1 is bonded by means of a temporary adhesive 2 to a carrier wafer 3. Subsequently, the wafer 1 is shaped on the carrier wafer 3 into a thinned wafer 4. Thereafter, a permanent adhesive 5 in accordance with the present invention is applied to the thinned wafer and baked. This is followed by bonding to the base wafer 6. Finally, the carrier wafer 3 is detached. This separation is carried out by detaching the temporary adhesive layer, under the effect of temperature, for example, which is located between the thinned wafer 4 and the carrier wafer 3. This second adhesive layer differs from the permanent adhesive of the present invention in particular in that it remains meltable and hence soluble following a temperature treatment. FIG. 1a shows the condition after the bonding of the wafer 1 carrying functional chips to the carrier wafer 3. FIG. 1b shows the situation after the thinning of the wafer 1 to give a thinned wafer 4 on the carrier wafer 3. FIG. 1c shows the condition following application and baking of the permanent adhesive 5. FIG. 1d shows the condition after bonding of a wafer 6 carrying functional chips by permanent adhesive 5, and FIG. 1e the condition after removal of the carrier wafer 3.

The chips lying one above the other on the two wafers can then be connected electrically to one another. In this case, it is possible first of all to etch the permanent adhesive, to clean the contact hole with cleaning solutions, and to fill it with a metal, such as tungsten, which can be done by means of a CVD process.

In the case of the chip and/or wafer bonding process of the invention, for example, a first wafer is spincoated with a poly-o-hydroxy amide, dried at 80–120° C. and then baked at 200–350° C. The second wafer is either treated in the same way as the first wafer or, more advantageously, is provided only with an adhesion promoter. In many cases it is sufficient for this wafer to have been cleaned with a solvent beforehand and baked at at least 200° C. The two wafers are then bonded to one another at an elevated temperature (100–350° C.). After bonding, the wafers are again baked at 300–430° C. The duration of the bake is 15–60 minutes. This baking converts the poly-o-hydroxy amide into the corresponding polybenzoxazole.

The bonding process of the invention requires no plasma activation or plasma equipment. The adhesive layer is active for a number of hours; in other words, there is no risk of deactivation even in the case of operations which take a very long time. Accordingly, the process is also very suitable for bonding chips to wafers.

The wafers or chips bonded to one another in accordance with the invention have a permanent bond. This bond is unaffected either by high temperatures of up to above 500° C. or by chemicals such as solvents, acids, bases or aggressive gases. This is very significant, because the bonded parts are interrupted in numerous processes such as etching, sputtering, chemical cleaning, etc. A further advantage lies in the fact that the poly-o-hydroxy amides absorb much less water than the polyimides known in the state of the art, and so the risk of blistering is much less. The chip stacks and wafer stacks show no stress-related cracks, flakes or creases, which is frequently a problem especially in the case of thinned wafers.

Overall it is a particular advantage of the present invention that by means of the invention it is possible to implement permanent and reliable stacking of wafers and/or chips, with the bonds being extremely stable with respect to temperature and chemical exposures and exhibiting substantially no mechanical defects.

The present invention further embraces articles comprising at least two parts which have been adhesively bonded using poly-o-hydroxy amides of the present invention. The articles in question are preferably bonded chips and/or wafers. These may be bonded to give stacks, which may contain, for example, up to 8, preferably 2–4, chips and/or wafers. Bonded chip and/or wafer stacks of this kind are one preferred embodiment of the present invention.

The present invention further relates to adhesive compositions containing 10–45% by weight, preferably 20–35% by weight, of a poly-o-hydroxy amide, 55–90% by weight, preferably 65–75% by weight, of an organic solvent, and optionally 0.1–10% by weight, preferably 0.1–5% by weight, more preferably 0.3–5% by weight, of a crosslinker, in each case based on the overall composition. It is preferred for the composition to contain no other constituents, i.e., to consist of the stated constituents. It is further preferred for the composition to contain no phenol compound additions, particularly not the phenol compounds (C) disclosed as being necessary in EP 807 852 B1. Furthermore, the composition preferably does not contain the organosilicon compounds (D) disclosed alternatively as being necessary in EP 807 852 B1.

The present invention is illustrated below with reference to examples, which are not intended, however, to restrict the scope of the invention.

BRIEF DESCRIPTION OF THE DRAWINGS

In the description, reference is made to the following figures.

FIG. 1a shows the condition after the bonding of the wafer 1 carrying functional chips to the carrier wafer 3. FIG. 1b shows the situation after the thinning of the wafer 1 to give a thinned wafer 4 on the carrier wafer 3. FIG. 1c shows the condition following application and baking of the permanent adhesive 5. FIG. 1d shows the condition after bonding of a wafer 6 carrying functional chips by permanent adhesive 5, and FIG. 1e the condition after removal of the carrier wafer 3.

Figure 1:
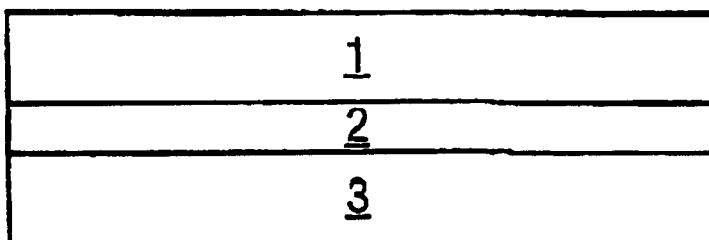
FIG. 1 shows a process of the invention for adhesively bonding wafers.
Figure 1:
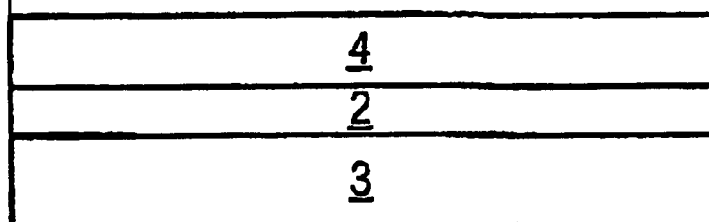
Figure 1:
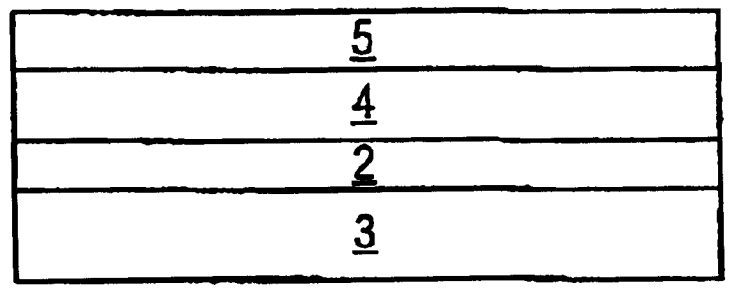
Figure 1:
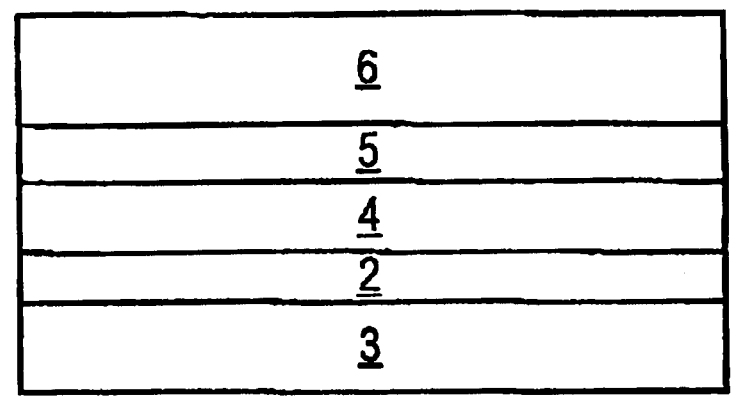
Figure 1:
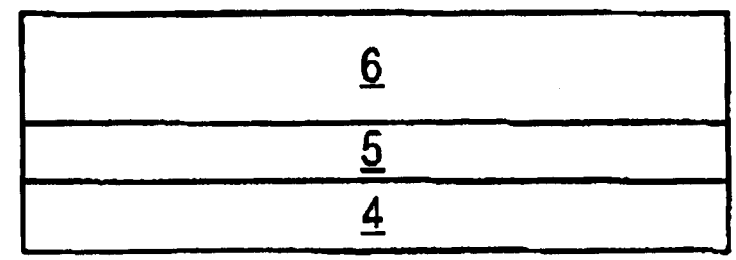

In the context of the present invention the following definitions apply:

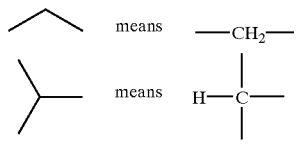

-continued

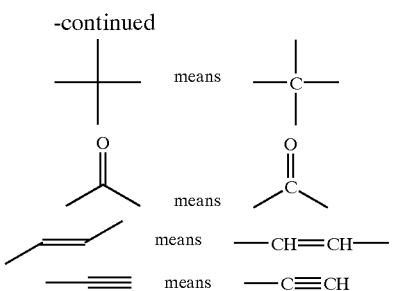

means for cyclic, branched, and linear compounds.

EXAMPLES

Chemicals Used:

Bisaminophenols:

9,9'-Bis(4-((3-hydroxy-4-amino)phenyloxy)phenyl) fluorene-(bisaminophenol 1)

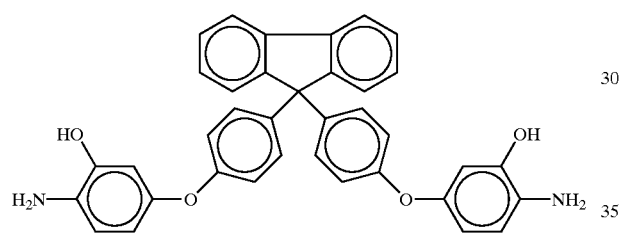

2,2-Bis(3-amino-4-hydroxyphenyl)hexafluoropropane-(bisaminophenol 2)

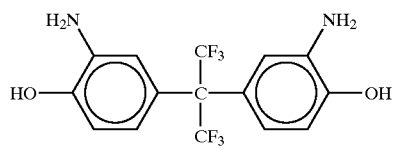

3,3'-Diamino-4,4,-dihydroxybiphenyl-(bisaminophenol 3)

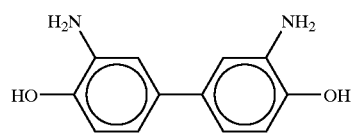

2,2-Bis(3-amino-4-hydroxyphenyl) sulfone-(bisaminophenol 4)

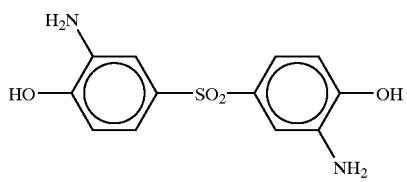

Dicarbonyl Chloride

Diphenyl ether 4,4'-dicarbonyl chloride-(dicarbonyl chloride 1)

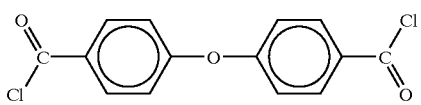

Diphenyl sulfone 4,4'-dicarbonyl chloride-(dicarbonyl chloride 2)

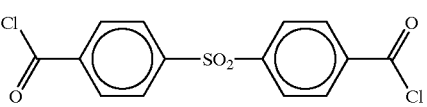

Pyridine-2,6-dicarbonyl dichloride-(dicarbonyl chloride 3)

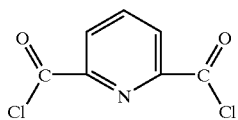

5-Ethynylisophthaloyl chloride-(dicarbonyl chloride 4)

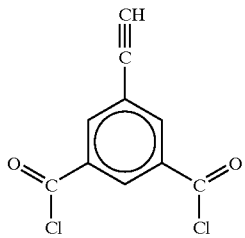

5-Norbornene-2,3-dicarbonyl dichloride-(dicarbonyl chloride 5)

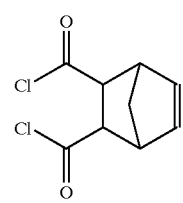

1,3-Bis(3-carboxypropyl)tetramethyldisiloxane-(dicarbonyl chloride 6)

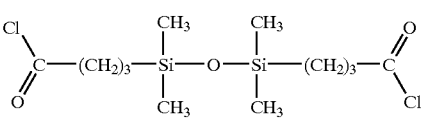

5-Allyloxyisophthaloyl dichloride-(dicarbonyl chloride 7)

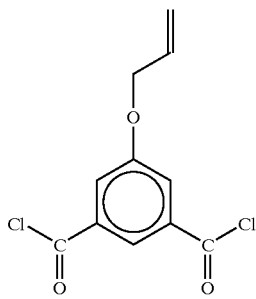

Endcap

Methacryloyl chloride-(endcap 1)

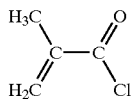

Acryloyl chloride-(endcap 2)

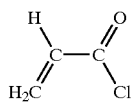

5-Norbornene-2-carbonyl chloride-(endcap 3)

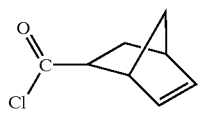

5-Norbornene-2,3-dicarboxylic anhydride-(endcap 4)

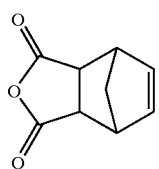

Maleic anhydride-(endcap 5)

Cinnamyl chloride-(endcap 6)

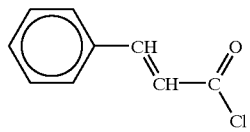

All polymer syntheses are carried out under dry nitrogen as inert gas.

Example 1

Polyhydroxyamide 1

338.76 g (0.6 mol) of bisaminophenol 1 are dissolved in 600 ml of distilled N-methylpyrrolidone (NMP). Added dropwise to this solution at 10° C. with stirring is a solution of 141.66 g (0.48 mol) of dicarbonyl chloride 1 in 550 ml of distilled γ-butyrolactone (γ-BL). The mixture is stirred at 10° C. for 1 hour and then at 20° C. for 1 hour. Following renewed cooling to 10° C., 25.09 g (0.24 mol) of endcap 1 in solution in 250 ml of distilled γ-BL are added dropwise to the reaction mixture, which is stirred at 10° C. for 1 hour and then at 20° C. for 1 hour. After cooling to 10° C., the reaction mixture is admixed with 126.5 g (1.6 mol) of pyridine in solution in 450 ml of distilled γ-BL, warmed to room temperature, and stirred for 2 hours.

To isolate the polymer the reaction mixture is filtered and the filtrate is introduced dropwise into a mixture of 2 l of deionized (DI) water and 200 ml of 2-propanol with stirring, a further 6 l of DI water being added during the dropwise introduction. The precipitated polymer is filtered off with suction and washed with 3 l of cold DI water. Following suction filtration, the polymer is stirred twice in 3 l each time of a 3% strength ammonia solution at room temperature for 1 hour and then filtered off with suction. The polymer is washed neutral with DI water, isolated by filtration, and dried for 72 hours at 50° C./10 mbar. The yield is 443 g.

The polyhydroxy amide prepared in this way is readily soluble in solvents such as NMP, γ-BL, tetrahydrofuran, cyclohexanone, cyclopentanone, diethylene glycol monomethyl ether.

Example 2

Polyhydroxy Amide 2

219.76 g (0.6 mol) of bisaminophenol 2 are dissolved in 600 ml of distilled N-methylpyrrolidone (NMP). Added dropwise to this solution at 10° C. with stirring is a solution of 141.66 g (0.48 mol) of dicarbonyl chloride 1 in 550 ml of distilled γ-butyrolactone (γ-BL). The mixture is stirred at 10° C. for 1 hour and then at 20° C. for 1 hour. Following renewed cooling to 10° C., 25.09 g (0.24 mol) of endcap 1 in solution in 250 ml of distilled γ-BL are added dropwise to the reaction mixture, which is stirred at 10° C. for 1 hour and then at 20° C. for 1 hour. After cooling to 10° C., the reaction mixture is admixed with 126.5 g (1.6 mol) of pyridine in solution in 450 ml of distilled γ-BL, warmed to room temperature, and stirred for 2 hours.

Polyhydroxy amide 2 is worked up as in example 1. Yield: 324 g.

Example 3

Polyhydroxy Amide 3

219.76 g (0.6 mol) of bisaminophenol 2 are dissolved in 600 ml of distilled N-methylpyrrolidone (NMP). Added dropwise to this solution at 10° C. with stirring is a solution of 164.72 g (0.48 mol) of dicarbonyl chloride 2 in 550 ml of distilled NMP. The mixture is stirred at 10° C. for 1 hour and then at 20° C. for 1 hour. Following renewed cooling to 10° C., 21.72 g (0.24 mol) of endcap 2 in solution in 250 ml of distilled γ-BL are added dropwise to the reaction mixture, which is stirred at 10° C. for 1 hour and then at 20° C. for 1 hour. After cooling to 10° C., the reaction mixture is admixed with 126.5 g (1.6 mol) of pyridine in solution in 450 ml of distilled γ-BL, warmed to room temperature, and stirred for 2 hours.

Polyhydroxy amide 3 is worked up as in example 1. Yield: 324 g.

Example 4

Polyhydroxy Amide 4

64.87 g (0.3 mol) of bisaminophenol 3 are dissolved in 300 ml of distilled N-methylpyrrolidone (NMP). Added dropwise to this solution at 10° C. with stirring is a solution of 48.96 g (0.24 mol) of dicarbonyl chloride 3 in 270 ml of distilled γ-butyrolactone (γ-BL). The mixture is stirred at 10° C. for 1 hour and then at 20° C. for 1 hour. Following renewed cooling to 10° C., 18.79 g (0.12 mol) of endcap 3 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 4 is worked up as in example 1. Yield: 105 g.

Example 5

Polyhydroxy Amide 5

84.09 g (0.3 mol) of bisaminophenol 4 are dissolved in 300 ml of distilled N-methylpyrrolidone (NMP). Added dropwise to this solution at 10° C. with stirring is a solution of 54.49 g (0.24 mol) of dicarbonyl chloride 4 in 270 ml of distilled γ-butyrolactone (γ-BL). The mixture is stirred at 10° C. for 1 hour and then at 20° C. for 1 hour. Following renewed cooling to 10° C., 19.7 g (0.12 mol) of endcap 4 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 5 is worked up as in example 1. Yield: 128 g.

Example 6

Polyhydroxy Amide 6

84.09 g (0.3 mol) of bisaminophenol 2 are dissolved in 300 ml of distilled N-methylpyrrolidone (NMP). Added dropwise to this solution at 10° C. with stirring is a solution of 52.57 g (0.24 mol) of dicarbonyl chloride 5 in 270 ml of distilled γ-butyrolactone (γ-BL). The mixture is stirred at 10° C. for 1 hour and then at 20° C. for 1 hour. Following renewed cooling to 10° C., 11.76 g (0.12 mol) of endcap 5 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 6 is worked up as in example 1. Yield: 112 g.

Example 7

Polyhydroxy Amide 7

84.09 g (0.3 mol) of bisaminophenol 2 are dissolved in 300 ml of distilled N-methylpyrrolidone (NMP). Added dropwise to this solution at 10° C. with stirring is a solution of 82.41 g (0.24 mol) of dicarbonyl chloride 6 in 270 ml of distilled γ-butyrolactone (γ-BL). The mixture is stirred at 10° C. for 1 hour and then at 20° C. for 1 hour. Following renewed cooling to 10° C., 20 g (0.12 mol) of endcap 6 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 7 is worked up as in example 1. Yield: 157 g.

Example 8

Polyhydroxy Amide 8

84.7 g (0.15 mol) of bisaminophenol 1 are dissolved in 300 ml of distilled N-methylpyrrolidone (NMP). Added dropwise to this solution at 10° C. with stirring is a solution of 31.19 g (0.12 mol) of dicarbonyl chloride 7 in 200 ml of distilled NMP. The mixture is stirred at 10° C. for 1 hour and then at 20° C. for 1 hour. Following renewed cooling to 10° C., 6.27 g (0.06 mol) of endcap 1 in solution in 50 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 8 is worked up as in example 1. Yield: 108 g.

Example 9

Polyhydroxy Amide 9

84.09 g (0.3 mol) of bisaminophenol 2 are dissolved in 300 ml of distilled N-methylpyrrolidone (NMP). Added dropwise to this solution at 10° C. with stirring is a solution of 92.71 g (0.27 mol) of dicarbonyl chloride 6 in 270 ml of distilled γ-butyrolactone (γ-BL). The mixture is stirred at 10° C. for 1 hour and then at 20° C. for 1 hour. Following renewed cooling to 10° C., 6.27 g (0.06 mol) of endcap 1 in solution in 80 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 9 is worked up as in example 1. Yield: 164 g.

Example 10

Polyhydroxy Amide 10

73.25 g (0.2 mol) of bisaminophenol 2 are dissolved in 250 ml of distilled N-methylpyrrolidone (NMP). Added dropwise to this solution at 10° C. with stirring is a solution of 34.32 g (0.1 mol) of dicarbonyl chloride 2 in 150 ml of distilled NMP. The mixture is stirred at 10° C. for 1 hour and then at 20° C. for 1 hour. Following renewed cooling to 10° C., 20.9 g (0.2 mol) of endcap 1 in solution in 200 ml of distilled γ-BL are added dropwise to the reaction mixture, which is stirred at 10° C. for 1 hour and then at 20° C. for 1 hour. After cooling to 10° C., the reaction mixture is admixed with 55.37 g (0.7 mol) of pyridine in solution in 450 ml of distilled γ-BL, warmed to room temperature, and stirred for 2 hours.

Polyhydroxy amide 10 is worked up as in example 1. Yield: 96 g.

Example 11

Polyhydroxy Amide 11

84.09 g (0.3 mol) of bisaminophenol 2 are dissolved in 300 ml of distilled N-methylpyrrolidone (NMP). Added dropwise to this solution at 10° C. with stirring is a solution of 99.58 g (0.29 mol) of dicarbonyl chloride 6 in 270 ml of distilled γ-butyrolactone (γ-BL). The mixture is stirred at 10° C. for 1 hour and then at 20° C. for 1 hour. After renewed cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 11 is worked up as in example 1. Yield: 159 g.

Example 12

Polyhydroxy Amide 12

81.28 g (0.29 mol) of bisaminophenol 4 are dissolved in 300 ml of distilled N-methylpyrrolidone (NMP). Added dropwise to this solution at 10° C. with stirring is a solution of 65.72 g (0.3 mol) of dicarbonyl chloride 5 in 270 ml of distilled γ-butyrolactone (γ-BL). The mixture is stirred at 10° C. for 1 hour and then at 20° C. for 1 hour. After renewed cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 12 is worked up as in example 1. Yield: 131 g.

Example 13

Polyhydroxy Amide 13

84.7 g (0.15 mol) of bisaminophenol 1 are dissolved in 300 ml of distilled N-methylpyrrolidone (NMP). Added dropwise to this solution at 10° C. with stirring is a solution of 23.61 g (0.08 mol) of dicarbonyl chloride 1 and 13.73 g (0.04 mol) of dicarbonyl chloride 2 in 200 ml of distilled NMP. The mixture is stirred at 10° C. for 1 hour and then at 20° C. for 1 hour. Following renewed cooling to 10° C., 9.85 g (0.06 mol) of endcap 4 in solution in 50 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 13 is worked up as in example 1. Yield: 109 g.

Example 14

Polyhydroxy Amide 14

84.09 g (0.3 mol) of bisaminophenol 2 are dissolved in 300 ml of distilled N-methylpyrrolidone (NMP). Added dropwise to this solution at 10° C. with stirring is a solution of 85.85 g (0.25 mol) of dicarbonyl chloride 6 and 9.08 g (0.04 mol) of dicarbonyl chloride 4 in 270 ml of distilled γ-butyrolactone (γ-BL). The mixture is stirred at 10° C. for 1 hour and then at 20° C. for 1 hour. Following renewed cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 14 is worked up as in example 1. Yield: 163 g.

Example 15

Polyhydroxy Amide 15

73.25 g (0.2 mol) of bisaminophenol 2 and 28.03 g (0.1 mol) of bisaminophenol 4 are dissolved in 350 ml of distilled N-methylpyrrolidone (NMP). Added dropwise to this solution at 10° C. with stirring is a solution of 70.83 g (0.24 mol) of dicarbonyl chloride 1 in 270 ml of distilled γ-butyrolactone (γ-BL). The mixture is stirred at 10° C. for 1 hour and then at 20° C. for 1 hour. Following renewed cooling to 10° C., 11.77 g (0.12 mol) of endcap 5 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 15 is worked up as in example 1. Yield: 161 g.

Example 16

Polyhydroxy Amide 16

73.25 g (0.2 mol) of bisaminophenol 2 and 21.62 g (0.1 mol) of bisaminophenol 3 are dissolved in 350 ml of distilled N-methylpyrrolidone (NMP). Added dropwise to this solution at 10° C. with stirring is a solution of 99.58 g (0.29 mol) of dicarbonyl chloride 6 in 270 ml of distilled γ-butyrolactone (γ-BL). The mixture is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 16 is worked up as in example 1. Yield: 175 g.

Example 17

Polyhydroxy Amide 17

73.25 g (0.2 mol) of bisaminophenol 2 and 28.03 g (0.1 mol) of bisaminophenol 4 are dissolved in 350 ml of distilled N-methylpyrrolidone (NMP). Added dropwise to this solution at 10° C. with stirring is a solution of 59.02 g (0.2 mol) of dicarbonyl chloride 1 and 34.6 g (0.04 mol) of dicarbonyl chloride 3 in 270 ml of distilled γ-butyrolactone (γ-BL). The mixture is stirred at 10° C. for 1 hour and then at 20° C. for 1 hour. Following renewed cooling to 10° C., 20 g (0.12 mol) of endcap 6 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 17 is worked up as in example 1. Yield: 162 g.

Example 18

Polyhydroxy Amide 18

73.25 g (0.2 mol) of bisaminophenol 2 and 28.03 g (0.1 mol) of bisaminophenol 4 are dissolved in 350 ml of distilled N-methylpyrrolidone (NMP). Added dropwise to this solution at 10° C. with stirring is a solution of 85.79 g (0.25 mol) of dicarbonyl chloride 2 and 10.39 g (0.04 ml) of dicarbonyl chloride 7 in 400 ml of distilled NMP. The mixture is stirred at 10° C. for 1 hour and then at 20° C. for 1 hour. After cooling to 10° C., the reaction mixture is admixed with 63.25 g (0.8 mol) of pyridine in solution in 450 ml of distilled γ-BL, warmed to room temperature, and stirred for 2 hours.

Polyhydroxy amide 18 is worked up as in example 1. Yield: 168 g

Example 19

Polyhydroxy Amide 19

54.94 g (0.15 mol) of bisaminophenol 2 are dissolved in 300 ml of distilled N-methylpyrrolidone (NMP). Added dropwise to this solution at 10° C. with stirring is a solution of 41.2 g (0.12 mol) of dicarbonyl chloride 6 in 270 ml of distilled γ-butyrolactone (γ-BL). The mixture is stirred at 10° C. for 1 hour and then at 20° C. for 1 hour.

In a further batch, 42.04 g (0.15 mol) of bisaminophenol 4 are dissolved in 300 ml of distilled N-methylpyrrolidone (NMP). Added dropwise to this solution at 10° C. with stirring is a solution of 27.24 g (0.12 mol) of dicarbonyl chloride 4 in 270 ml of distilled γ-BL. The mixture is stirred at 10° C. for 1 hour and then at 20° C. for 1 hour. The two batches are combined at 10° C. with stirring. The mixture is stirred at 10° C. for 1 hour and then at 20° C. for 1 hour. Following renewed cooling to 10° C., 20 g (0.12 mol) of endcap 6 in solution in 170 ml of distilled γ-BL are added dropwise to the reaction mixture, which is stirred at 10° C. for 1 hour and then at 20° C. for 1 hour. After cooling to 10° C., the reaction mixture is admixed with 63.25 g (0.8 mol) of pyridine in solution in 450 ml of γ-BL, warmed to room temperature, and stirred for 2 hours.

Polyhydroxy amide 19 is worked up as in example 1. Yield: 157 g.

Example 20

Determination of the Thermal Stabilities

The polyhydroxy amides prepared exhibit thermal stabilities of >450° C. according to TGA (thermogravimetric analyses; instrument: STA 1500 from Rheometric Scientific, heating rate: 5K/min, inert gas: argon). The isothermal mass loss per hour at 400° C. for 10 hours is <0.8%.

Accordingly, the polyhydroxy amides prepared meet the requirements for the intended applications.

Example 21

Preparation of Polymer Solutions (Adhesive Solutions)

30 g of the polyhydroxy amides prepared in examples 1 to 19 are dissolved in 70 g of distilled NMP (VLSI—Selectipur®) or distilled γ-BL (VLSI—Selectipur®). The dissolving operation takes place appropriately on a shaker apparatus at room temperature. The solution is then filtered under pressure through a 0.2 μm filter into a cleaned, particle-free, glass sample vessel. The viscosity of the polymer solution can be modified by varying the mass of polyhydroxy amide dissolved.

Example 22

Preparation of Polymer Solutions (Adhesive Solutions) with Addition of Crosslinkers By using additional crosslinkers it is possible to exert a positive influence on the cure behavior, the strength, and the thermal and chemical stability of the polyhydroxy amides. As crosslinkers in this case it is possible to use short-chain compounds containing at least two groups which are capable of addition polymerization or polycondensation (see table). These crosslinkers may be added to the polymer solution at from 0.5 to 10 percent by mass based on the polyhydroxy amide.

Examples of Crosslinking Compounds

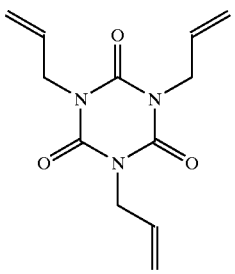

V1

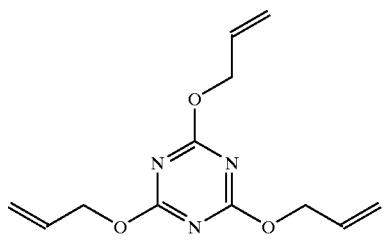

V2

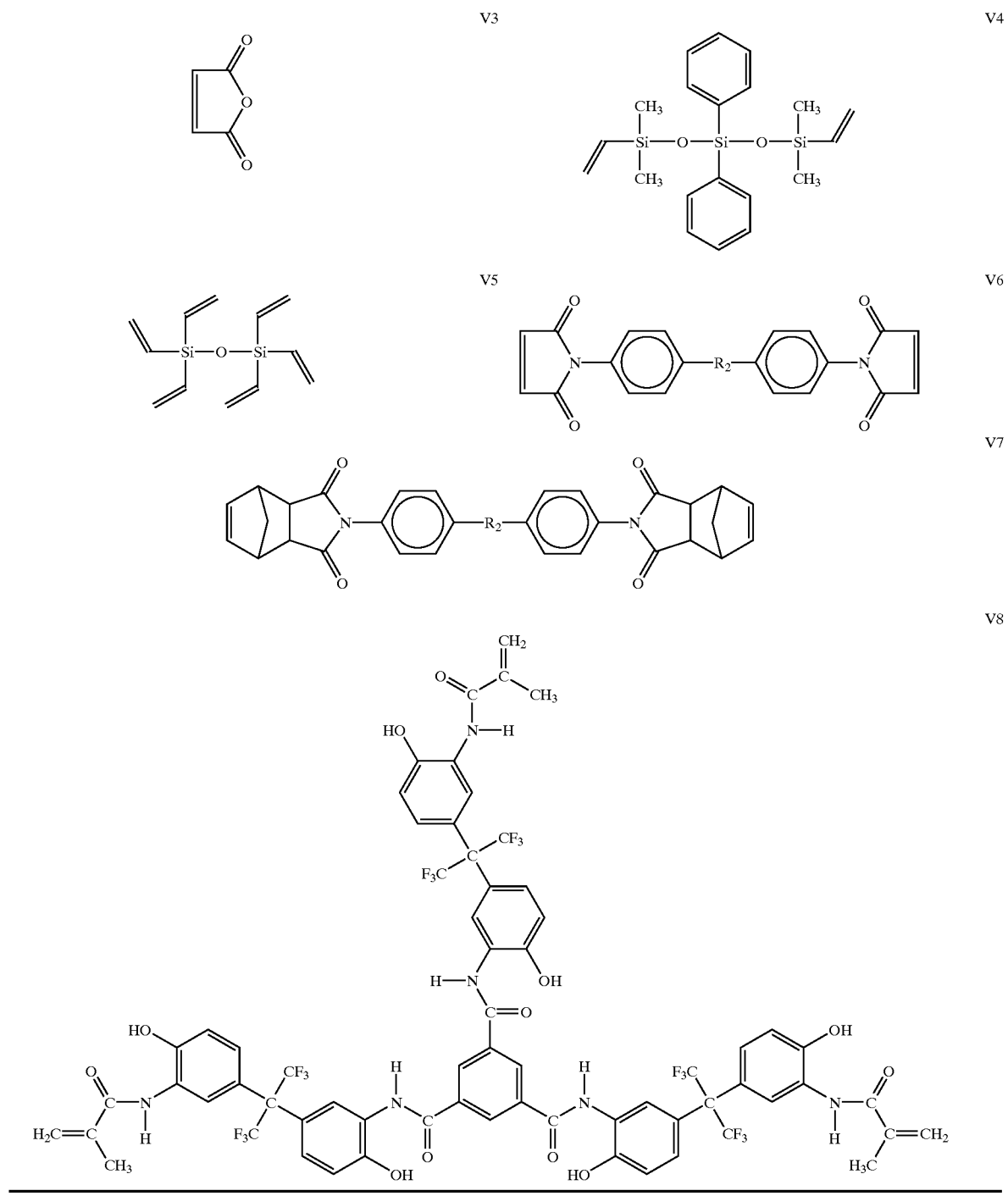

where R2 is as defined above.

30 g of the polyhydroxy amides and 0.3 g of crosslinker prepared in examples 1 to 19 and dissolved in 70 g of distilled NMP (VLSI—Selectipur®) or distilled γ-BL (VLSI—Selectipur®). The dissolving operation takes place appropriately on a shaker apparatus at room temperature. The solution is then filtered under pressure through a 0.2 μm filter into a cleaned, particle-free, glass sample vessel. The viscosity of the polymer solution can be modified by varying the mass of polyhydroxy amide dissolved.

Formulations with 1% addition of crosslinker are marked accordingly in the subsequent examples.

Example 23

Preparation of Adhesion Promoter Solutions

By using adhesion promoters it is possible to enhance the wetting of the surface to be bonded and thus the adhesion of the polyhydroxy amides to surfaces relevant in microelectronics, such as silicon, silicon oxide, silicon nitride, tantalum nitride, glass or quartz, for example.

Examples of adhesion promoters (HV) used include the following compounds:

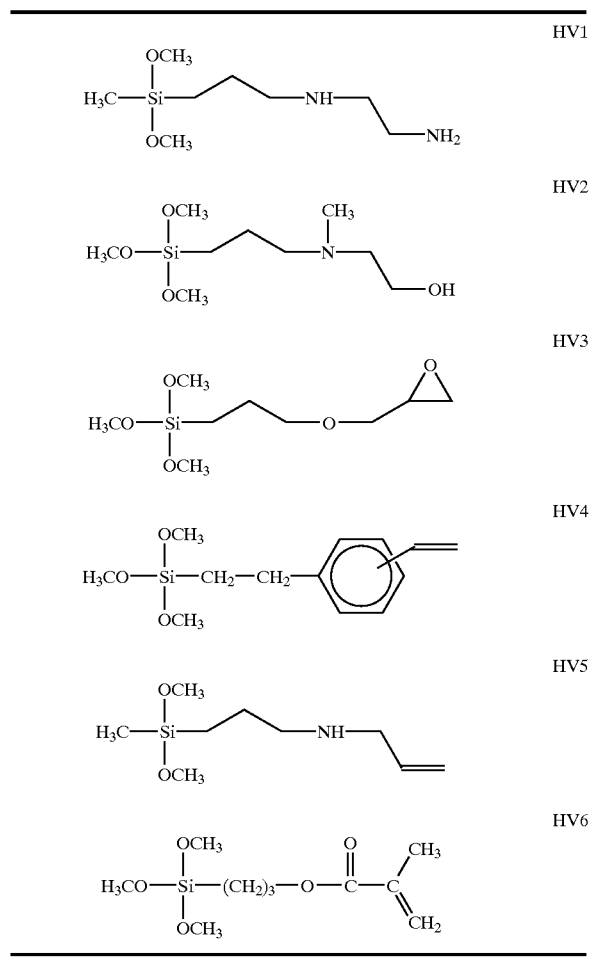

0.5 g of adhesion promoter (e.g., N-(2-aminoethyl)-3-amino-propylmethyldimethoxysilane) is dissolved in 95 g of methanol, ethanol or isopropanol (VLSI—Selectipur®) and 5 g of DI water in a cleaned, particle-free, glass sample vessel at room temperature. After standing at room temperature for 24 hours, the adhesion promoter solution is ready for use. This solution can be used for a maximum of 3 weeks.

The adhesion promoter is applied to the substrate by spin-coating, spraying or dipping techniques and the substrate is subsequently dried at 90° C. for 1 minute. In general, temperatures of between 80° and 150° C. can be used for drying, and the time can be between 20 sec and 10 min.

The substrates treated with adhesion promoter are labeled accordingly in the examples.

Example 24

Improvement to the Adhesion by Roughening of the Surface to be Bonded

In order to remove oxide layers in the case of metals and/or to roughen the surface it is advantageous to carry out a mechanical abrasion process, brushing and/or sandblasting. The surfaces to be bonded are therefore treated with an abrasive. The removal of dust residues can be accomplished by blowing with compressed air or washing in water. In the examples, the substrates treated with abrasive have been given the corresponding label.

Example 25

Cleaning of the Surfaces to be Bonded

In order to remove residues of oil and fats or other impurities, the components to be bonded may be treated with solvents such as acetone, alcohols, halogenated hydrocarbons or aromatic hydrocarbons. The component can be cleaned by rubbing down with lint-free materials, dipping in the solvent at room temperature or an elevated temperature, or in an ultrasound bath.

Cleaning may also be accomplished by means of plasma or flaming. In that case the component to be bonded is held in a plasma flow or in a flame for a short period of about 1 minute.

In the examples, the substrates cleaned by means of solvent (NMP and acetone), oxygen plasma and flaming are labeled accordingly.

Example 26

Application of the Adhesion Promoter

The adhesion promoter should produce a monomolecular layer on the surface of the parts to be bonded. The adhesion promoter can be applied appropriately by spincoating. For that purpose the adhesion promoter solution of example 23 is applied to the area to be bonded, through a 0.2 $\mu$m primary filter, and spun at 5 000 rpm for 30 s. This is followed by a drying step at 100° C. for 60 s. Another possibility for applying the adhesion promoter is to dip the area to be bonded in the adhesion promoter solution and then blow the area dry.

Example 27

Application of the Adhesive as a Powder

The polyhydroxy amides prepared according to examples 1 to 19 are dried and then comminuted in a mortar or in a powder mill. The adhesive powder obtained in this way is spread uniformly over a surface of the parts to be bonded, by tipping and spreading, for example. By heating of the component at 200° C. to 280° C., the adhesive powder is converted into a homogeneous melt and then the components are bonded to one another. The examples indicate the form in which the adhesive was applied.

Example 28

Application of the Adhesive as a Solution by Spincoating

The adhesive solutions prepared according to example 21 is applied by syringe to the surface to be bonded and is uniformly distributed using a spincoater. The rotary speed of the spincoater is 2 500 rpm, the spin time 20 sec. For removing the solvent, this is followed by a drying step at 200° C. for 4 minutes on a hotplate or in an oven.

Example 29

Application of the Adhesive as a Solution by Spraying

The adhesive solutions prepared according to example 21 are applied uniformly by spraygun to the surface to be bonded. For removing the solvent, this is followed by a drying step at 200° C. for 4 minutes on a hotplate or in an oven.

Example 30

Application of the Adhesive as a Solution by Brushing

The adhesive solutions prepared according to example 21 are applied uniformly by brush to the surface to be bonded. For removing the solvent, this is followed by a drying step at 200° C. for 4 minutes on a hotplate or in an oven.

Example 31

Adhesive Bonding

The components prepared in accordance with the following examples are brought together on a hotplate at a temperature of 250° C. and bonded at this temperature for 2 minutes with a pressing force of 2 N/cm².

| Temperature range, general: | 150° C. to 350° C. |
| Range for bonding time: | 0.5 min to 20 min |
| Range for pressing force: | 0.5 to 20 N/cm² |

After this, an option is to carry out a baking step at from 300° C. to 420° C. in an oven for 1 h.

Example 32

Bonding of Titanium Nitride and Determination of the Adhesion

A cleaned 4" (diameter 10.25 cm) silicon wafer is sputtered with a titanium nitride layer 50 nm thick. The polyhydroxy amide is applied to this wafer in accordance with the method specified in the list, and heated on a hotplate. Thereafter, on the hotplate 10, silicon chips measuring 4×4 mm², likewise cleaned beforehand and sputtered on the surface with 50 nm titanium nitride, are pressed onto the polyhydroxy amide for adhesive bonding. This stack is then heat-treated at 400° C. in an oven, in a nitrogen atmosphere, for 1 h. After cooling to room temperature, an adhesion test is carried out by means of a shear tester, Dage Series 400.

The list below shows the polymer used in the first column.

Column 2 shows the shear force measured.
Column 3 shows surface treatment of the components to be bonded (L=solvent; M=mech. abrasion; B=flaming; PL=plasma)
Column 4 shows whether and, if so, which adhesion promoter was used.
Column 5 shows the type of bonding (S=spincoating; T=dipping; P=brushing; SP=spraying; PU=powder melting)
Column 6 shows whether and, if so, which crosslinker was added.

| Polyhydroxy amide 1 | 19.48 N/mm² | L  | HV1 | S  | —  |
| Polyhydroxy amide 2 | 20.85 N/mm² | L  | HV1 | S  | —  |
| Polyhydroxy amide 3 | 18.47 N/mm² | PL | —   | S  | —  |
| Polyhydroxy amide 4 | 21.61 N/mm² | L  | HV2 | SP | V1 |
| Polyhydroxy amide 5 | 19.94 N/mm² | L  | HV3 | S  | —  |

Example 33

Bonding of Tantalum Nitride and Determination of the Adhesion

Experiment carried out exactly the same as for titanium nitride (example 32), with the difference that, here, the surface of the wafer and of the chips consisted not of titanium nitride but instead of tantalum nitride.

Average shear force measured:

| Polyhydroxy amide 6  | 17.98 N/mm² | L  | —   | S  | V2 |
| Polyhydroxy amide 7  | 21.15 N/mm² | L  | HV1 | S  | V3 |
| Polyhydroxy amide 8  | 19.67 N/mm² | L  | HV1 | S  | —  |
| Polyhydroxy amide 9  | 20.11 N/mm² | PL | —   | P  | —  |
| Polyhydroxy amide 10 | 18.13 N/mm² | L  | —   | SP | —  |

Example 34

Bonding of Silicon and Determination of the Adhesion

Experiment carried out exactly the same as for titanium nitride (example 32), with the difference that, here, the surface of the wafer and of the chips consisted not of titanium nitride but instead of silicon.

Average shear force measured:

| Polyhydroxy amide 11 | 22.48 N/mm² | PL | —   | S  | —  |
| Polyhydroxy amide 12 | 21.97 N/mm² | PL | HV3 | SP | V4 |
| Polyhydroxy amide 13 | 20.17 N/mm² | L  | HV4 | S  | V5 |
| Polyhydroxy amide 14 | 19.29 N/mm² | L  | HV1 | S  | —  |
| Polyhydroxy amide 15 | 21.34 N/mm² | L  | —   | P  | —  |

Example 35

Bonding of Glass and Determination of the Adhesion

Experiment carried out exactly the same as in example 32, with the difference that here, a glass plate and 4×4 mm glass chips (i.e. glass platelets) were used.

Average shear force measured:

| Polyhydroxy amide 16 | 19.14 N/mm² | L  | HV1 | S  | —  |
| Polyhydroxy amide 17 | 20.18 N/mm² | PL | HV4 | SP | V6 |
| Polyhydroxy amide 18 | 18.52 N/mm² | PL | HV5 | S  | —  |
| Polyhydroxy amide 19 | 17.94 N/mm² | L  | —   | T  | —  |
| Polyhydroxy amide 1  | 20.12 N/mm² | L  | HV6 | S  | V7 |

Example 36

Bonding of Quartz Glass and Determination of the Adhesion

Experiment carried out exactly the same as in example 32, with the difference that here, a quartz wafer and 4×4 mm quartz chips were used.

Average shear force measured:

| | | | | | |
|---|---|---|---|---|---|
| Polyhydroxy amide 16 | 19.14 N/mm² | L | HV3 | S | — |
| Polyhydroxy amide 17 | 20.18 N/mm² | L | HV1 | S | V4 |
| Polyhydroxy amide 18 | 18.52 N/mm² | PL | — | T | — |
| Polyhydroxy amide 19 | 17.94 N/mm² | PL | — | PU | — |
| Polyhydroxy amide 1 | 20.12 N/mm² | PL | HV2 | P | V1 |

Example 37

Bonding of Copper and Determination of the Adhesion

Experiment carried out exactly the same as in example 32, with the difference that here, copper plates and 4×4 mm copper chips were used.

Average shear force measured:

| | | | | | |
|---|---|---|---|---|---|
| Polyhydroxy amide 1 | 22.34 N/mm² | M | HV1 | P | V2 |
| Polyhydroxy amide 3 | 20.94 N/mm² | B | — | PU | — |
| Polyhydroxy amide 7 | 21.79 N/mm² | L | HV2 | SP | V4 |
| Polyhydroxy amide 11 | 23.16 N/mm² | M | — | S | — |
| Polyhydroxy amide 15 | 20.93 N/mm² | L | — | S | — |

Example 38

Bonding of Brass and Determination of the Adhesion

Experiment carried out exactly the same as in example 32, with the difference that here, brass plates and 4×4 mm brass chips (brass platelets) were used.

Average shear force measured:

| | | | | | |
|---|---|---|---|---|---|
| Polyhydroxy amide 3 | 21.83 N/mm² | B | HV1 | S | V1 |
| Polyhydroxy amide 5 | 21.14 N/mm² | M | — | SP | V6 |
| Polyhydroxy amide 6 | 19.99 N/mm² | L | — | P | V3 |
| Polyhydroxy amide 12 | 21.13 N/mm² | M | HV2 | T | — |
| Polyhydroxy amide 17 | 20.05 N/mm² | M | — | S | — |

Example 39

Bonding of Steel and Determination of the Adhesion

Experiment carried out exactly the same as in example 32, with the difference that here, steel plates and 4×4 mm steel chips were used.

Average shear force measured:

| | | | | | |
|---|---|---|---|---|---|
| Polyhydroxy amide 4 | 17.93 N/mm² | B | — | S | V3 |
| Polyhydroxy amide 8 | 19.35 N/mm² | M | HV4 | SP | V7 |
| Polyhydroxy amide 9 | 18.06 N/mm² | M | — | T | — |
| Polyhydroxy amide 14 | 17.19 N/mm² | L | — | PU | — |
| Polyhydroxy amide 17 | 20.14 N/mm² | M | HV2 | S | — |

Example 40

Bonding of Aluminum and Determination of the Adhesion

Experiment carried out exactly the same as in example 32, with the difference that here, aluminum plates and 4×4 mm aluminum chips were used.

Average shear force measured:

| | | | | | |
|---|---|---|---|---|---|
| Polyhydroxy amide 1 | 19.19 N/mm² | M | HV2 | S | V4 |
| Polyhydroxy amide 6 | 17.03 N/mm² | M | HV5 | S | V8 |
| Polyhydroxy amide 10 | 16.93 N/mm² | L | — | PU | — |
| Polyhydroxy amide 12 | 20.11 N/mm² | M | — | T | — |
| Polyhydroxy amide 13 | 18.83 N/mm² | L | — | P | — |

Example 41

Bonding of Ceramic and Determination of the Adhesion

Experiment carried out exactly the same as in example 32, with the difference that here, ceramic plates and 4×4 mm ceramic chips were used.

Average shear force measured:

| | | | | | |
|---|---|---|---|---|---|
| Polyhydroxy amide 1 | 22.07 N/mm² | L | HV4 | T | V2 |
| Polyhydroxy amide 2 | 21.31 N/mm² | PL | HV3 | S | V6 |
| Polyhydroxy amide 17 | 20.71 N/mm² | PL | HV5 | P | — |
| Polyhydroxy amide 18 | 20.56 N/mm² | L | — | S | — |
| Polyhydroxy amide 19 | 19.43 N/mm² | B | — | PU | — |

Example 42

Bonding of Marble and Determination of the Adhesion

Experiment carried out exactly the same as in example 32, with the difference that here, marble plates and 4×4 mm marble platelets were used.

Average shear force measured:

| | | | | | |
|---|---|---|---|---|---|
| Polyhydroxy amide 4 | 23.19 N/mm² | B | HV3 | P | V1 |
| Polyhydroxy amide 5 | 24.37 N/mm² | M | — | P | — |
| Polyhydroxy amide 6 | 24.71 N/mm² | M | — | T | V7 |
| Polyhydroxy amide 10 | 22.51 N/mm² | M | — | PU | — |
| Polyhydroxy amide 12 | 21.90 N/mm² | M | — | PU | — |

Example 43

Bonding of Granite and Determination of the Adhesion

Experiment carried out exactly the same as in example 32, with the difference that here, granite and 4×4 mm granite fragments were used.

Average shear force measured:

| | | | | | |
|---|---|---|---|---|---|
| Polyhydroxy amide 2 | 22.19 N/mm² | B | HV1 | P | V5 |
| Polyhydroxy amide 3 | 20.04 N/mm² | L | HV3 | P | — |
| Polyhydroxy amide 9 | 21.41 N/mm² | M | — | PU | — |
| Polyhydroxy amide 13 | 21.14 N/mm² | M | — | PU | — |
| Polyhydroxy amide 14 | 19.47 N/mm² | M | — | T | — |

Example 44

Bonding of Silicon Carbide and Determination of the Adhesion

Experiment carried out exactly the same as in example 32, with the difference that here, silicon carbide wafers and 4×4 mm silicon carbide chips were used.

Average shear force measured:

| | | | | | |
|---|---|---|---|---|---|
| Polyhydroxy amide 5 | 16.19 N/mm² | L | — | S | — |
| Polyhydroxy amide 7 | 17.83 N/mm² | L | — | S | V6 |
| Polyhydroxy amide 9 | 19.53 N/mm² | L | HV3 | T | — |
| Polyhydroxy amide 11 | 18.83 N/mm² | L | HV1 | SP | V8 |
| Polyhydroxy amide 14 | 17.60 N/mm² | L | — | S | — |

Example 45

Bonding of Silicon with Copper and Determination of the Adhesion

Experiment carried out exactly the same as in example 32, with the difference that here, silicon wafers and 4×4 mm copper fragments were used.

Average shear force measured:

| | | | | | |
|---|---|---|---|---|---|
| Polyhydroxy amide 1 | 17.83 N/mm² | L | — | S | V3 |
| Polyhydroxy amide 2 | 18.02 N/mm² | M | HV1 | S | V2 |
| Polyhydroxy amide 3 | 16.92 N/mm² | B | — | SP | — |
| Polyhydroxy amide 10 | 17.93 N/mm² | L | HV2 | P | — |
| Polyhydroxy amide 11 | 19.02 N/mm² | L | HV5 | S | V6 |

Example 46

Bonding of Silicon with Ceramic and Determination of the Adhesion

Experiment carried out exactly the same as in example 32, with the difference that here, silicon wafers and 4×4 mm ceramic chips were used.

Average shear force measured:

| | | | | | |
|---|---|---|---|---|---|
| Polyhydroxy amide 3 | 20.13 N/mm² | L | HV3 | S | V4 |
| Polyhydroxy amide 7 | 20.14 N/mm² | PL | HV4 | S | V7 |
| Polyhydroxy amide 8 | 19.37 N/mm² | PL | HV1 | SP | — |
| Polyhydroxy amide 12 | 18.19 N/mm² | L | HV5 | T | — |
| Polyhydroxy amide 14 | 17.42 N/mm² | L | — | PU | — |

Example 47

Bonding of Silicon with Glass and Determination of the Adhesion

Experiment carried out exactly the same as in example 32, with the difference that here, silicon wafers and 4×4 mm glass chips were used.

Average shear force measured:

| | | | | | |
|---|---|---|---|---|---|
| Polyhydroxy amide 2 | 19.49 N/mm² | L | HV1 | S | V1 |
| Polyhydroxy amide 6 | 18.09 N/mm² | PL | HV2 | S | V8 |
| Polyhydroxy amide 7 | 18.43 N/mm² | PL | HV2 | SP | V7 |
| Polyhydroxy amide 15 | 17.79 N/mm² | L | — | PU | — |
| Polyhydroxy amide 16 | 19.39 N/mm² | L | HV1 | T | — |

Example 48

Bonding of Aluminum with Glass and Determination of the Adhesion

Experiment carried out exactly the same as in example 32, with the difference that here, aluminum wafers and 4×4 mm glass chips were used.

Average shear force measured:

| | | | | | |
|---|---|---|---|---|---|
| Polyhydroxy amide 4 | 17.43 N/mm² | L | — | PU | — |
| Polyhydroxy amide 5 | 19.47 N/mm² | L | HV1 | S | V7 |
| Polyhydroxy amide 6 | 16.21 N/mm² | M | — | T | — |
| Polyhydroxy amide 17 | 20.03 N/mm² | M | HV6 | S | — |
| Polyhydroxy amide 18 | 19.41 N/mm² | L | HV3 | S | — |

Example 49

Bonding of Steel and Glass and Determination of the Adhesion

Experiment carried out exactly the same as in example 32, with the difference that here, steel plates and 4×4 mm glass chips were used.

Average shear force measured:

| | | | | | |
|---|---|---|---|---|---|
| Polyhydroxy amide 1 | 16.39 N/mm² | L | — | PU | — |
| Polyhydroxy amide 5 | 17.64 N/mm² | M | HV2 | S | V4 |
| Polyhydroxy amide 9 | 15.92 N/mm² | M | — | SP | — |
| Polyhydroxy amide 17 | 18.34 N/mm² | L | HV1 | S | V2 |
| Polyhydroxy amide 19 | 17.27 N/mm² | L | HV1 | S | — |

Example 50

Bonding of Ceramic with Glass and Determination of the Adhesion

Experiment carried out exactly the same as in example 32, with the difference that here, a ceramic plate and 4×4 mm glass chips were used.

Average shear force measured:

| | | | | | |
|---|---|---|---|---|---|
| Polyhydroxy amide 2 | 16.52 N/mm² | PL | — | PU | — |
| Polyhydroxy amide 3 | 17.14 N/mm² | PL | HV4 | S | V3 |
| Polyhydroxy amide 4 | 18.21 N/mm² | L | HV2 | S | V3 |
| Polyhydroxy amide 11 | 15.93 N/mm² | L | — | T | — |
| Polyhydroxy amide 15 | 16.17 N/mm² | L | — | T | — |

Example 51

Bonding of Copper with Aluminum and Determination of the Adhesion

Experiment carried out exactly the same as in example 32, with the difference that here, copper plates and 4×4 mm aluminum fragments were used.

Average shear force measured:

| | | | | | |
|---|---|---|---|---|---|
| Polyhydroxy amide 1 | 20.36 N/mm² | M | HV4 | S | V6 |
| Polyhydroxy amide 6 | 19.17 N/mm² | M | — | PU | — |
| Polyhydroxy amide 8 | 20.43 N/mm² | M | HV6 | S | V8 |
| Polyhydroxy amide 10 | 18.73 N/mm² | L | — | SP | — |
| Polyhydroxy amide 17 | 18.27 N/mm² | M | — | T | — |

Example 52

Comparative Example, Adhesion

The polyimide PIMEL G-7636C from Asahi Kasei was dissolved in NMP as in example 21 and bonded as in example 32. Using the shear tester from Dage, Series 4000, the following average adhesion values were measured:

| | |
|---|---|
| Titanium nitride surface: | 13.26 N/mm² |
| Tantalum nitride surface: | 14.61 N/mm² |
| Silicon surface: | 14.31 N/mm² |
| Glass surface: | 12.18 N/mm² |
| Copper surface: | 13.52 N/mm² |
| Steel surface: | 10.38 N/mm² |
| Ceramic surface: | 13.03 N/mm² |

Example 53

Determination of the Stability to Organic Solvents

The adhesive bonds produced in accordance with examples 32 to 51 were heated at 40° C. in acetone for 3 h, at 40° C. in chloroform for 3 h, at 60° C. in toluene for 3 h, and at 80° C. in NMP for 3 h. The wafer was then washed with DI water. The wafer was dried in vacuo at 200° C. for 60 minutes and the adhesion was determined using the shear tester from Dage, Series 4000. The bonded examples 32 to 50 showed no signs of detachment. According to this test, the bond strength remained unchanged.

Example 54

Determination of the Stability to Acids

The components produced in accordance with examples 32 to 35, 41, 44, 46, and 47 were stored in concentrated hydrochloric acid at room temperature (25° C.) for 5 h and in 50% strength sulfuric acid at 60° C. for 5 h. The bond was then washed with DI water. The bond was dried in vacuo at 200° C. for 60 minutes and the adhesion was determined by means of the shear tester from Dage, Series 4000. The bonded parts showed no signs of detachment. The bond strength remained unchanged.

Example 55

Determination of the Stability to Bases

The bonds produced in accordance with examples 32, 33, 37 to 39 and 41 to 44 were stored in concentrated potassium hydroxide solution at 40° C. for 24 h and in concentrated ammonia solution at RT for 24 h. The bond was then washed with DI water. The bond was dried in vacuo at 200° C. for 60 minutes and the adhesion was determined by means of the shear tester from Dage, Series 4000. The bonded parts showed signs [sic] of detachment. The bond strength remained unchanged.

Signs of detachment. The bond strength remained unchanged. [sic]

Example 56

Determination of the Water Absorption

A bond produced in accordance with examples 32 to 52 with a known mass of adhesive, polyhydroxy amide 1, was weighed with a DeltaRange AT261 analytical balance and then stored in water at 80° C. for 10 h. After a short drying step of 15 minutes at 50° C. in a drying cabinet, the weight was determined again. The percentage water absorption, based on the mass of adhesive, was calculated from the difference in mass.

Water absorption determined:

| | |
|---|---|
| Example 32: | 0.5% |
| Example 33: | 0.4% |
| Example 35: | 0.4% |
| Example 40: | 0.6% |
| Example 43: | 0.5% |
| Example 47: | 0.3% |
| Comparative example 52: | 3.9% |

Example 57

Determination of the Adhesion after Thermal Exposure Testing

The bonds produced in accordance with examples 32 to 51 were heated in an oven at 450° C. under nitrogen for 1 hour. After cooling, the shear test was carried out in each case. The bond strength remained unchanged.

Example 58

Determination of the Adhesion after Climatic Testing

A [sic] bonds produced in accordance with examples 32 to 51 were thermally exposed in a Vötsch VT7004 climate cabinet between −50° C. and 150° C. for 500 cycles. Following this treatment, a shear test was carried out in each case. The bond strength remained unchanged.

Example 59

Determination of the Adhesion at 250° C.

The adhesion of a bond produced in accordance with examples 32 to 52 using polyhydroxy amide 1 was tested on a shear tester from Dage, Series 4000 with hotplate, at 250° C.

Average adhesion values:

| | |
|---|---|
| Example 32: | 16.15 N/mm² |
| Example 35: | 16.52 N/mm² |
| Example 38: | 15.84 N/mm² |
| Example 40: | 16.88 N/mm² |
| Example 42: | 17.04 N/mm² |
| Example 50: | 16.59 N/mm² |
| Comparative example 52: | 9.41 N/mm² |

Example 60

Polyhydroxy Amide 20

(a=b=c=d=0)

109.88 g (0.3 mol) of bisaminophenol 2 are dissolved in 300 ml of distilled N-methylpyrrolidone (NMP). Added dropwise to this solution at 10° C. with stirring is a solution of 62.72 g (0.6 mol) of endcap 1 in 150 ml of distilled γ-BL. The mixture is stirred at 10° C. for 1 hour and then at 20° C. for 1 hour.

After cooling to 10° C., the reaction mixture is admixed with 63.25 g (0.8 mol) of pyridine in solution in 150 ml of distilled γ-BL, warmed to room temperature, and stirred for 2 hours.

Polyhydroxy amide 20 is worked up as in example 1. Yield: 142 g.

Example 61

Comparative Example

A polyhydroxy amide prepared in accordance with example 1 of U.S. Pat. No. 5,077,378 with the same dissolution in NMP as in example 21 and analogous adhesive bonding as in example 32 gave the following average adhesion values:

| | |
|---|---|
| Titanium nitride surface: | 14.71 N/mm² |
| Tantalum nitride surface: | 15.69 N/mm² |
| Silicon surface: | 15.21 N/mm² |
| Glass surface: | 12.42 N/mm² |
| Copper surface: | 13.92 N/mm² |
| Steel surface: | 11.38 N/mm² |
| Ceramic surface: | 12.42 N/mm² |

What is claimed is:

1. A method of adhesively bonding materials or components, comprising:
   (a) providing a poly-o-hydroxy amides of the following general formula (I):

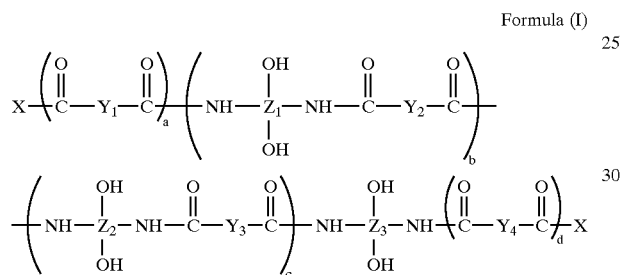

Formula (I)

where a and d independently of one another are 0 or 1, b=0–100, and c=0–100;

where X if a or d=0, i.e., if X is attached to NH, has the following definition:
—H, alkylcarbonyl, alkenylcarbonyl, cycloalkenylcarbonyl, arylcarbonyl, aralkylcarbonyl, aralkenylcarbonyl, aralkynylcarbonyl or heterocycloalkylcarbonyl each unsubstituted or substituted, it being possible for the carbonyl group to be attached to the aromatic moiety, heterocycle, or alkyl, alkenyl or alkynyl group;

and X if a or d=1, i.e., if X is attached to CO, has the following definition:
hydroxy, substituted or unsubstituted alkoxy, alkenoxy, aryloxy, cycloalkenoxy, amino, alkylamino, alkenylamino, arylamino, arylalkenoxy, arylalkylamino;

$Y_1$ to $Y_4$ independently of one another have the following definition:
substituted or unsubstituted aryl, a substituted or unsubstituted polynuclear aromatic hydrocarbon compound, a substituted or unsubstituted fused ring system, or alkyl, alkenyl, alkynyl, aralkyl, aralkenyl, aralkynyl, heterocyclo or cycloalkenyl each unsubstituted or substituted;

$Z_1$ to $Z_3$ have the following definition, where $Z_1$ to $Z_3$ can be identical to or different than one another:
aryl, aralkyl, aralkenyl, aralkynyl, heteroaryl, a polynuclear aromatic hydrocarbon compound or a fused ring system each unsubstituted or substituted (b) applying the poly-o-hydroxy amides to an area of material and/or components to be bonded;
(c) contacting the areas to be bonded with one another; and
(d) cross-linking the poly-o-hydroxy amides.

2. The method according to claim 1, wherein b=1–20.
3. The method according to claim 1, wherein c=0–20.
4. The method according to claim 1, wherein X, if a or d=0, i.e., if X is attached to NH, is:

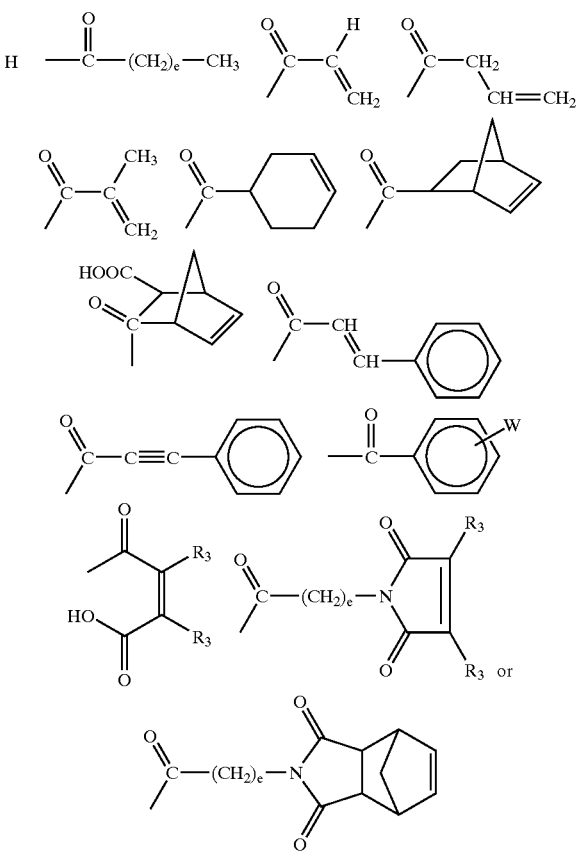

where e=0–10;
$R_3$ is: —H, and also:

—$(CH_2)_k$—$CH_3$ (k=0–10) —$(CF_2)_k$—$CF_3$ (k=0–10)

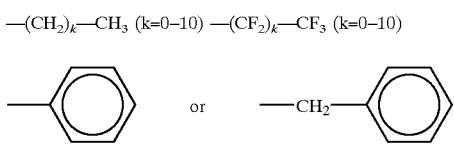

W is:

—H —CN —$CH(CH_3)_2$ —$C(CH_3)_3$

—$(CH_2)_e$—$CH_3$ —$(CF_2)_e$—$CF_3$ —Q—$(CH_2)_e$—$CH_3$
—Q—$(CF_2)_e$—$CF_3$

—Q—$CH_2$—CH=$CH_2$  —CH=$CH_2$  —C≡CH

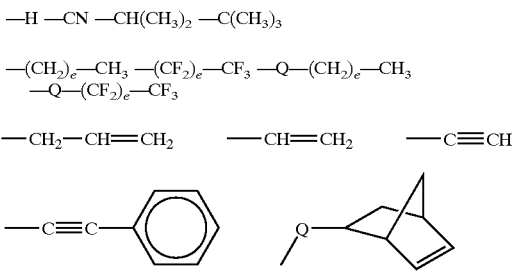

-continued
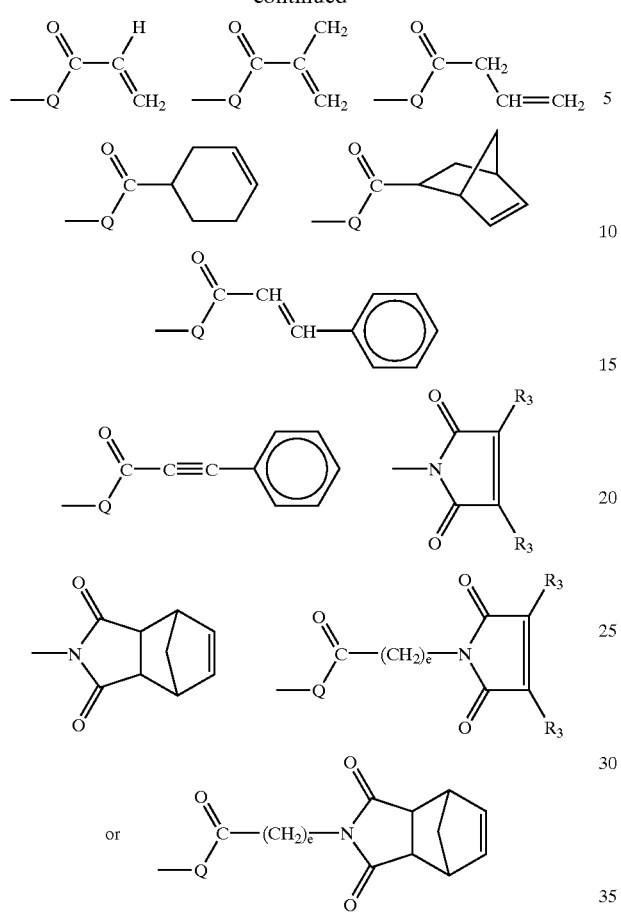
where e=0–10;
and Q is: —O—, —S— or —NH—.
5. The method according to claim 1, wherein X, if a or d=1, i.e., if X is attached to CO, is:
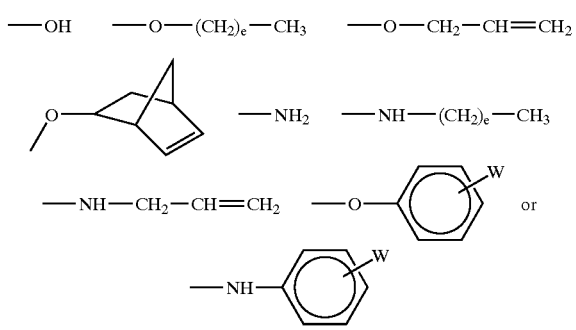
where e=0–10;
and W is:
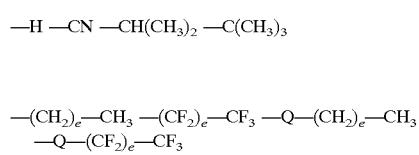
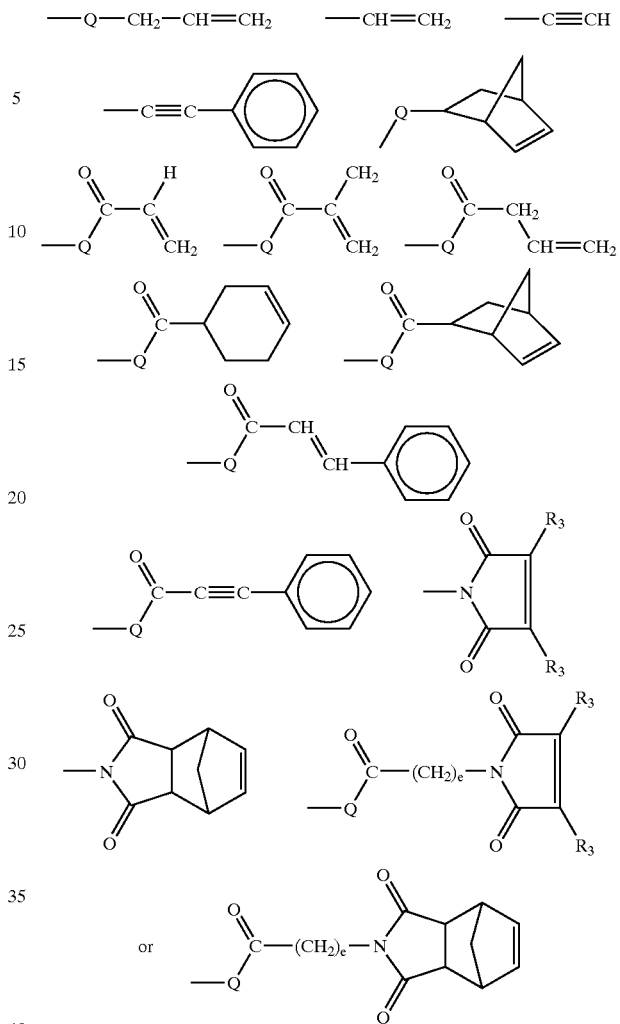
where e=0–10:
and Q is: —O—, —S— or —NH—.
6. The method according to claim 1, wherein $Y_1$ to $Y_4$ independently of one another are:
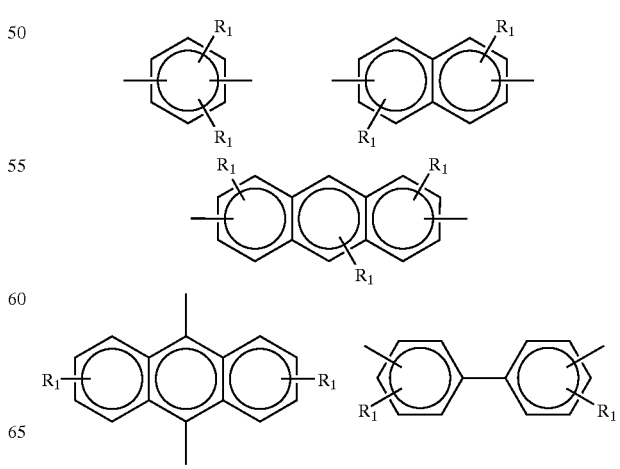

-continued
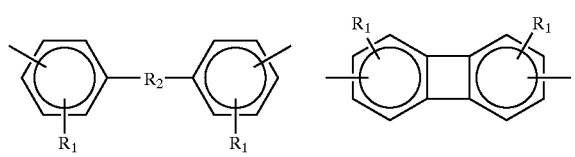
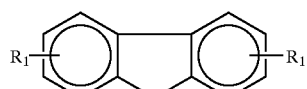
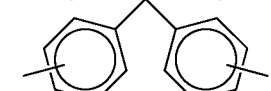
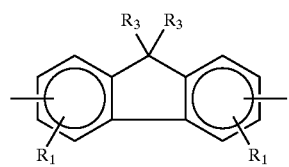
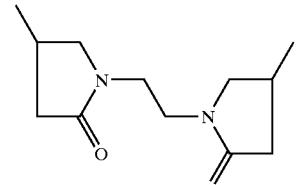
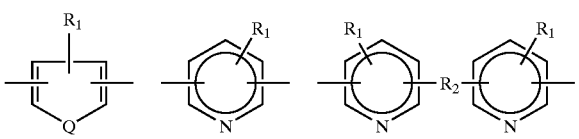
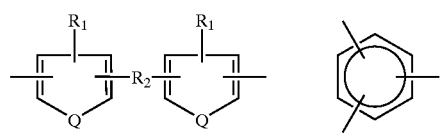
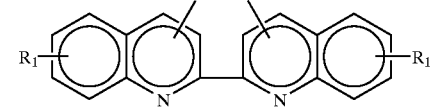
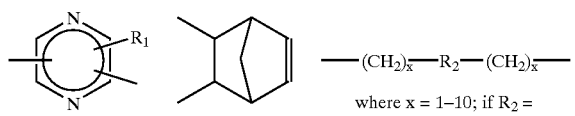
where x = 1–10; if $R_2$ = —$CH_2$—, then x = 0–10
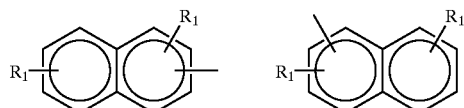
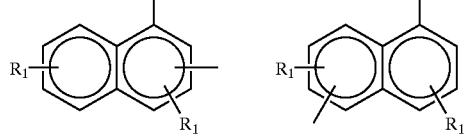
-continued
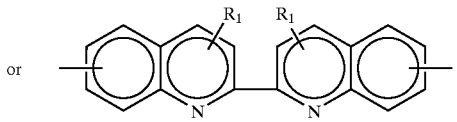
or
where Q is: —O—, —S— or —NH—;
$R_1$ is: —H, —$CF_3$, —OH, —SH, —COOH, —$N(R_4)_2$, alkyl, aryl, heteroaryl, and also:
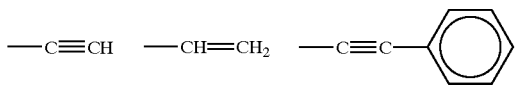
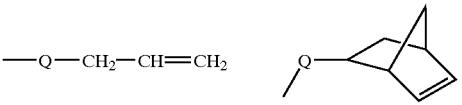
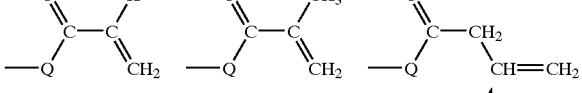
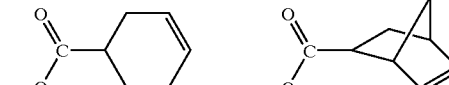
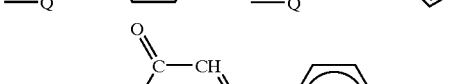
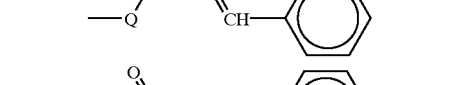
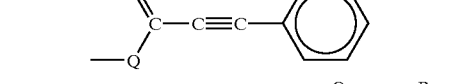
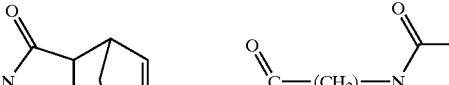
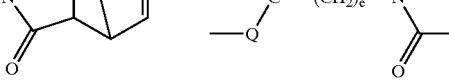
or
where e=0–10;
Q is: —O—, —S— or —NH—;
$R_2$ is: —O—, —CO—, —$NR_3$, —S—, —$SO_2$—, —$S_2$, —$CH_2$—, or:
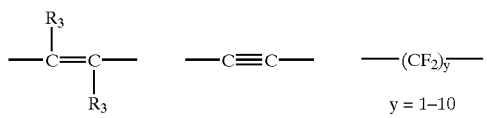
y = 1–10

-continued
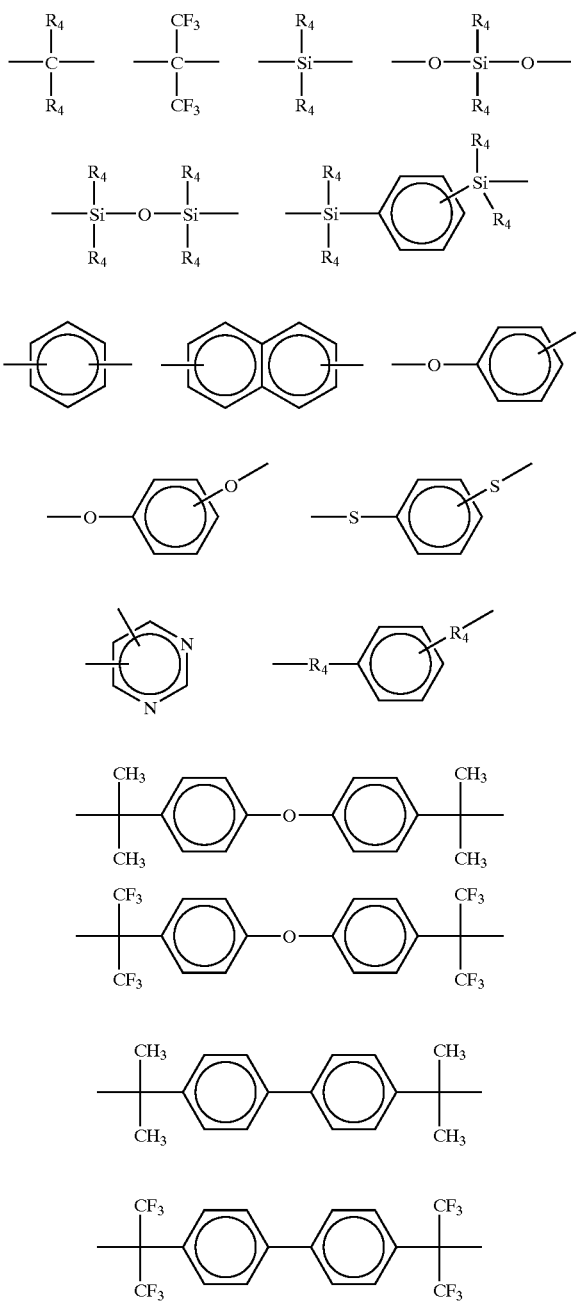
$R_3$ is: —H , and also:
—(CH$_2$)$_k$—(k=0–10)  —(CF$_2$)$_k$—CF$_3$ (k=0–10)
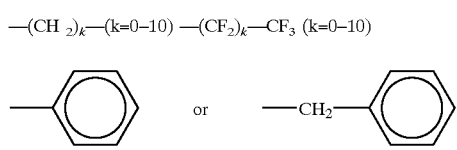
and $R_4$ is: alkyl having from 1 to 10 carbon atoms, aryl or heteroaryl.
7. The method according to claim 1, wherein $Z_1$ to $Z_3$, which may be identical to or different than one another, are:
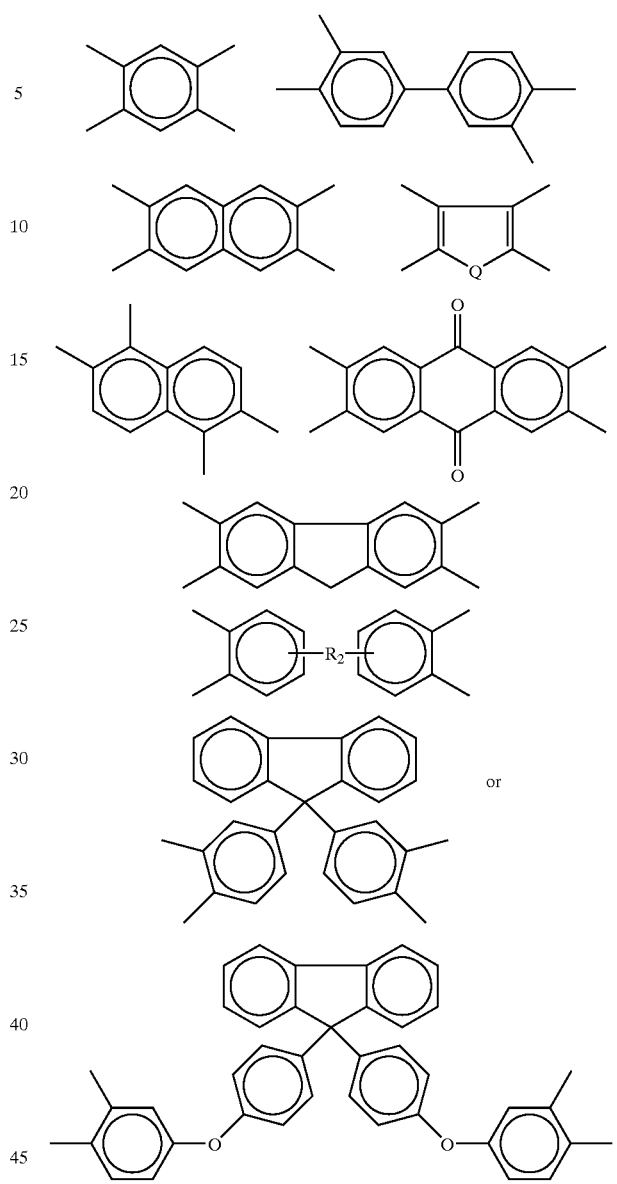
where Q is: —O—, —S— or —NH—;
and $R_2$ is —O—, —CO—, —NR$_3$—, —S—, —SO$_2$—, —S$_2$—, —CH$_2$—, or:
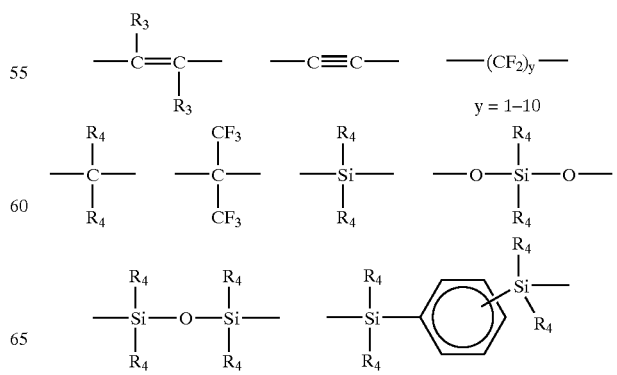

-continued

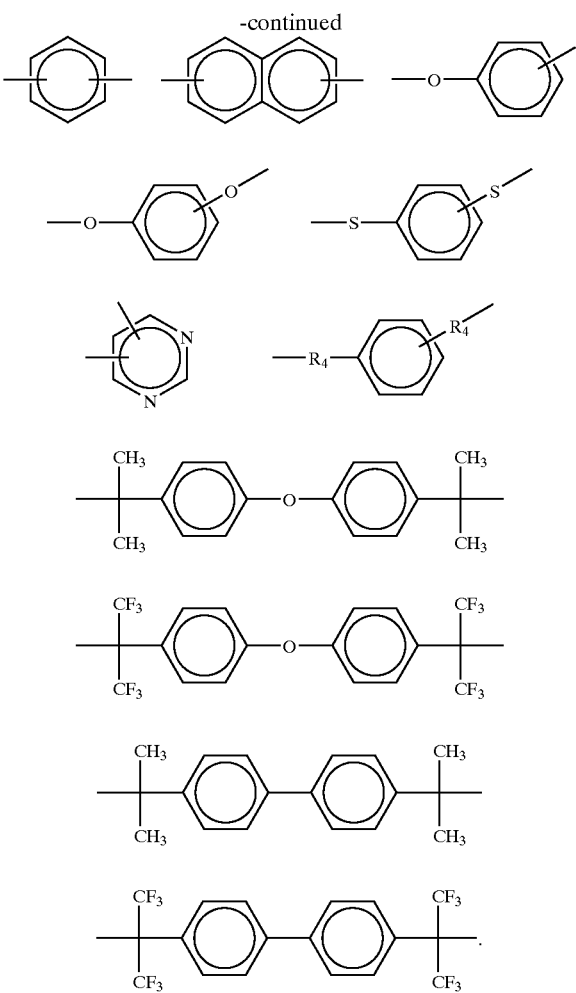

8. The method according to claim 1, wherein the material and/or components to be bonded are composed of a material selected from the group consisting of aluminum, titanium, vanadium, chromium, manganese, iron, cobalt, nickel, copper, zinc, steel, brass, palladium; silver, tin, tantalum, tungsten, platinum, gold, lead, carbon, including layers containing carbon and deposited by means of plasma, carbon fibers, silicon or germanium, and/or alloys or compounds of these materials.

9. The method according to claim 8 for adhesively bonding components or materials used in microelectronics and optoelectronics.

10. The method according to claim 8 for adhesively bonding chips and/or wafers.

11. The method according to claim 8 for adhesively bonding ceramics, glass ceramics, glasses, clayware, porcelain, stoneware and/or silicates or minerals.

12. The method according to claim 1, wherein the crosslinking of the poly-o-hydroxy amides is carried out by means of temperature treatment, laser treatment, ultrasound or microwave treatment.

13. The method according to claim 1, wherein the poly-o-hydroxy amides are applied in the form of a powder and the powder is converted by heating into a melt.

14. The method according to claim 1, wherein the poly-o-hydroxy amides are present in the form of a melt and are applied by spincoating, spraying or spreading and/or brushing.

15. The method according to claim 1, wherein the poly-o-hydroxy amides are in the form of a solution in an organic solvent and are applied by spincoating, spraying or spreading and/or brushing.

16. The method according to claim 15, wherein N-methylpyrrolidone, γ-butyrolactone, ethyl lactate, ethoxyethyl propionate, tetrahydrofuran (THF), cyclopentanone, cyclohexanone, ethyl acetate, isopropanol, ethanol, acetone or diethylene glycol monomethyl ether are used as organic solvents.

17. The method according to claim 15, wherein the solution of PHA and of organic solvent 0.1–10% by weight, based on the overall composition, of a crosslinker are present.

18. The method according to claim 1, wherein prior to the application of the poly-o-hydroxy amides the areas to be bonded are roughened and/or cleaned.

19. The method according to claim 1, wherein prior to the application of the poly-o-hydroxy amide an adhesion promoter is applied to at least one area to be bonded.

20. The method according to claim 19, wherein the adhesion promoter is applied to one of the areas to be bonded and the poly-o-hydroxy amide is applied to the other area.

21. The method according to claim 19, wherein silanes containing at least one alkoxy group, selected from one or more of the following compounds, is as adhesion promoters:

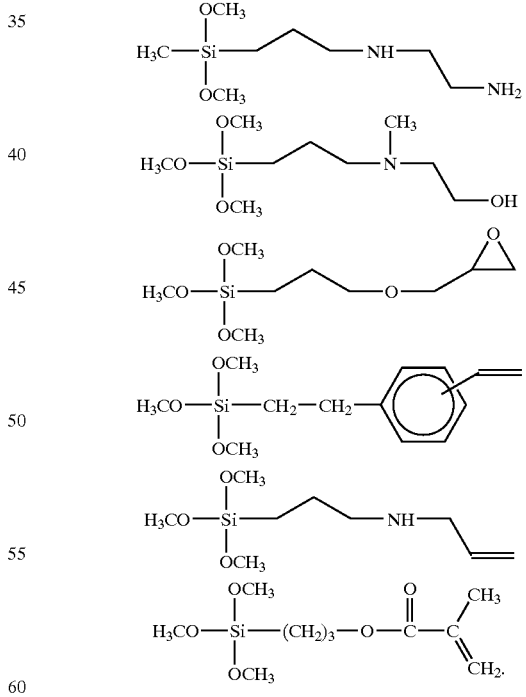

22. The method according to claim 1, wherein the bonded components are chips and/or wafers.

23. Article comprising at least two parts which have been bonded using poly-o-hydroxy amides of the following general formula (I):

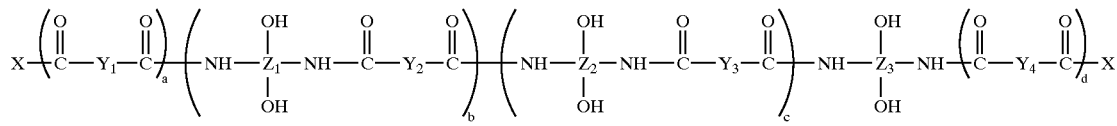

Formula (I)

where a and d independently of one another are 0 or 1, b=0–100, and c=0–100;

where X if a or d=0, i.e., if X is attached to NH, has the following definition:
—H, alkylcarbonyl, alkenylcarbonyl, cycloalkenylcarbonyl, arylcarbonyl, aralkylcarbonyl, aralkenylcarbonyl, aralkynylcarbonyl or heterocycloalkylcarbonyl each unsubstituted or substituted, it being possible for the carbonyl group to be attached to the aromatic moiety, heterocycle, or alkyl, alkenyl or alkynyl group;

and X if a or d=1, i.e., if X is attached to CO, has the following definition:
hydroxy, substituted or unsubstituted alkoxy, alkenoxy, aryloxy, cycloalkenoxy, amino, alkylamino, alkenylamino, arylamino, arylalkenoxy, arylalkylamino;

$Y_1$ to $Y_4$ independently of one another have the following definition:
substituted or unsubstituted aryl, a substituted or unsubstituted polynuclear aromatic hydrocarbon compound, a substituted or unsubstituted fused ring system, or alkyl, alkenyl, alkynyl, aralkyl, aralkenyl, aralkynyl, heterocyclo or cycloalkenyl each unsubstituted or substituted;

$Z_1$ to $Z_3$ have the following definition, where $Z_1$ to $Z_3$ can be identical to or different than one another:
aryl, aralkyl, aralkenyl, aralkynyl, heteroaryl, a polynuclear aromatic hydrocarbon compound or a fused ring system each unsubstituted or substituted.

24. The article according to claim 23, comprising bonded chips and/or wafers.

25. The article according to claim 24, comprising chip stacks and/or wafer stacks.

26. Adhesive composition, comprising: 10–45% by weight of a poly-o-hydroxy amide the following general formula (I):

being possible for the carbonyl group to be attached to the aromatic moiety, heterocycle, or alkyl, alkenyl or alkynyl group;

and X if a or d=1, i.e., if X is attached to CO, has the following definition:
hydroxy, substituted or unsubstituted alkoxy, alkenoxy, aryloxy, cycloalkenoxy, amino, alkylamino, alkenylamino, arylamino, arylalkenoxy, arylalkylamino;

$Y_1$ to $Y_4$ independently of one another have the following definition:
substituted or unsubstituted aryl, a substituted or unsubstituted polynuclear aromatic hydrocarbon compound, a substituted or unsubstituted fused ring system, or alkyl, alkenyl, alkynyl, aralkyl, aralkenyl, aralkynyl, heterocyclo or cycloalkenyl each unsubstituted or substituted;

$Z_1$ to $Z_3$ have the following definition, where $Z_1$ to $Z_3$ can be identical to or different than one another:
aryl, aralkyl, aralkenyl, aralkynyl, heteroaryl, a polynuclear aromatic hydrocarbon compound or a fused ring system each unsubstituted or substituted, and 55–90% by weight of an organic solvent.

27. The method according to claim 1, comprising baking the poly-o-hydroxy amides for converting the poly-o-hydroxy into polybenzoxazoles.

28. The method according to claim 1, wherein the material and/or components to be bonded are composed of a material selected from the group consisting of silicon carbide, silicon nitride, silicon oxide, titanium nitride, tantalum nitride, silicon oxynitride, tungsten nitride, gallium arsenide, gallium nitride, gallium indium phosphite, indium-tin oxide and/or glasses, ceramics, glass ceramics, clayware, porcelain, stoneware, and silicates.

29. The method according to claim 3, wherein c=1–20.

Formula (I)

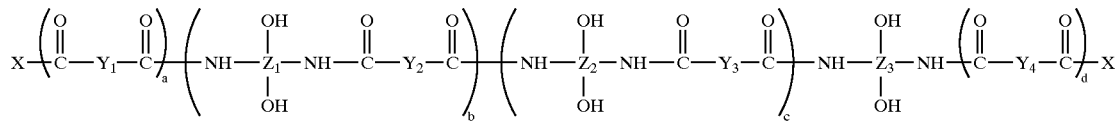

where a and d independently of one another are 0 or 1, b=0–100; and c=0–100;

where X if a or d=0, i.e., if X is attached to NH, has the following definition:
—H, alkylcarbonyl, alkenylcarbonyl, cycloalkenylcarbonyl, arylcarbonyl, aralkylcarbonyl, aralkenylcarbonyl, aralkynylcarbonyl or heterocycloalkylcarbonyl each unsubstituted or substituted, it 30. The method according to claim 8 for adhesively bonding marble, basalt, limestone, granite and/or concrete.

31. Process according to claim 15, wherein in the solution of PHA and of organic solvent 0.1–5%, based on the overall composition, of a crosslinker are present.

32. The adhesive composition according to claim 26, comprising 0.1–10% by weight of a crosslinker.

* * * * *